(12) United States Patent
Oeftering et al.

(10) Patent No.: US 6,368,482 B1
(45) Date of Patent: Apr. 9, 2002

(54) PLATING PROCESSES UTILIZING HIGH INTENSITY ACOUSTIC BEAMS

(75) Inventors: Richard C. Oeftering, Amherst, OH (US); Charles Denofrio, West Dundee, IL (US)

(73) Assignee: The United States of America as represented by the Administrator of the National Aeronautics and Space Administration, Washington, DC (US), Washington, DC (US)

( * ) Notice: Subject to any disclaimer, the term of this patent is extended or adjusted under 35 U.S.C. 154(b) by 0 days.

(21) Appl. No.: 09/669,052

(22) Filed: Sep. 19, 2000

(51) Int. Cl.[7] .............................. C25D 5/00; C25D 5/02; C25D 5/08
(52) U.S. Cl. ...................... 205/91; 205/103; 205/118; 205/133; 205/134; 205/135; 204/222; 204/273; 427/553; 427/595
(58) Field of Search ........................... 205/91, 103, 118, 205/133, 134, 135; 204/222, 273; 427/553, 595

(56) References Cited

U.S. PATENT DOCUMENTS

| 4,871,435 | A | | 10/1989 | Denofrio |
| 4,915,796 | A | | 4/1990 | Denofrio |
| 5,173,169 | A | * | 12/1992 | Garrison et al. |

OTHER PUBLICATIONS

Oeftering, Richard C: Acoustic Liquid Maipulation; 1999 Ultrasonic Symposium, Oct. 21, 1999.

* cited by examiner

*Primary Examiner*—Arun S. Phasge
(74) *Attorney, Agent, or Firm*—Kent N. Stone

(57) ABSTRACT

A system and a method for selective plating processes are disclosed which use directed beams of high intensity acoustic waves to create non-linear effects that alter and improve the plating process. The directed beams are focused on the surface of an object, which in one embodiment is immersed in a plating solution, and in another embodiment is suspended above a plating solution. The plating processes provide precise control of the thickness of the layers of the plating, while at the same time, in at least some incidents, eliminates the need for masking.

67 Claims, 9 Drawing Sheets

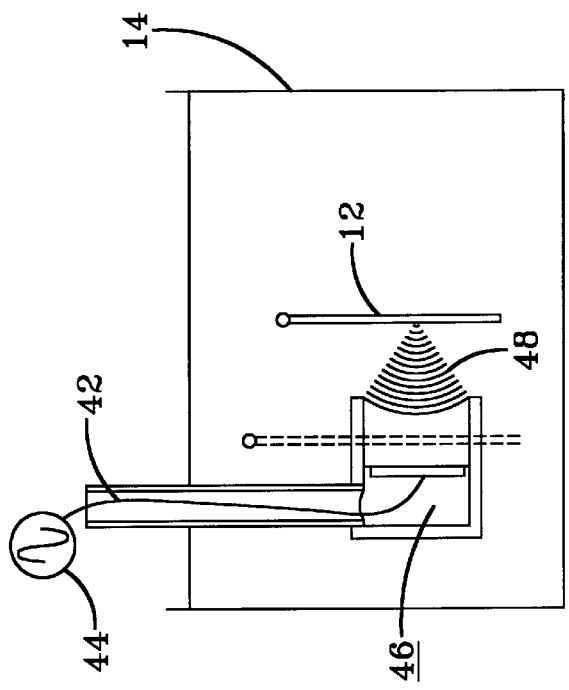
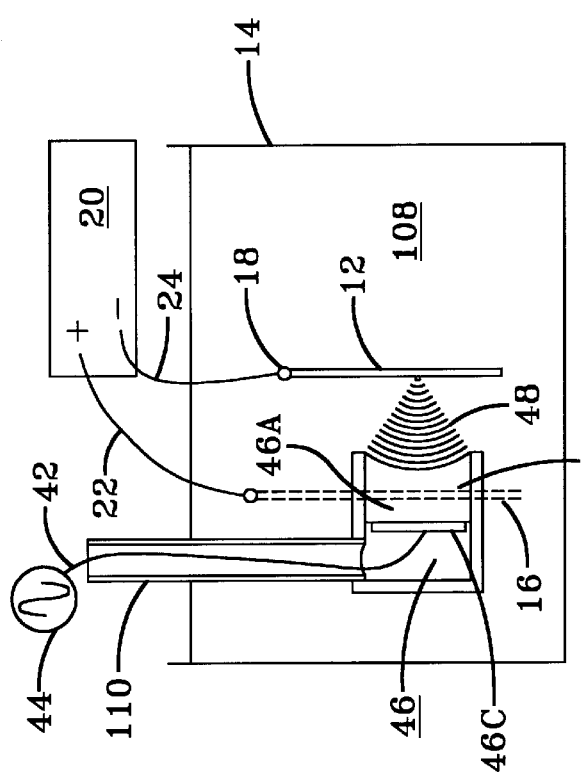
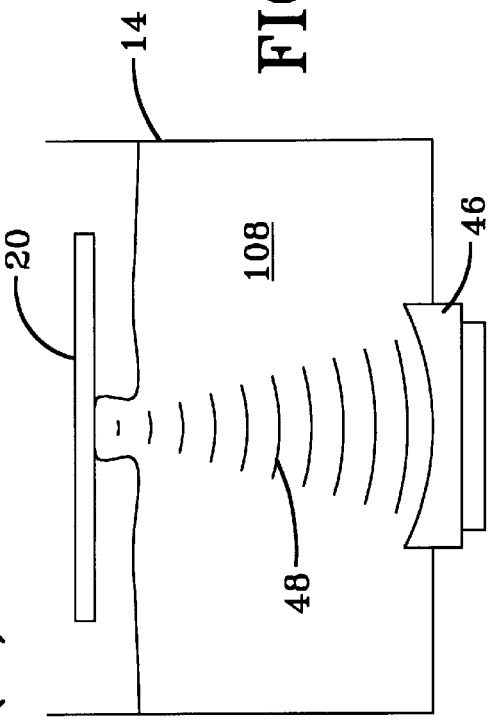
FIG-3(A)
FIG-3(B)
FIG-3(C)

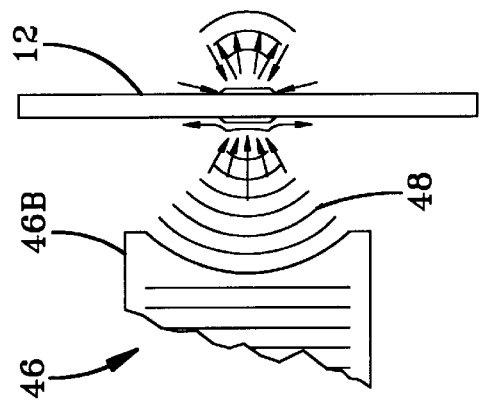
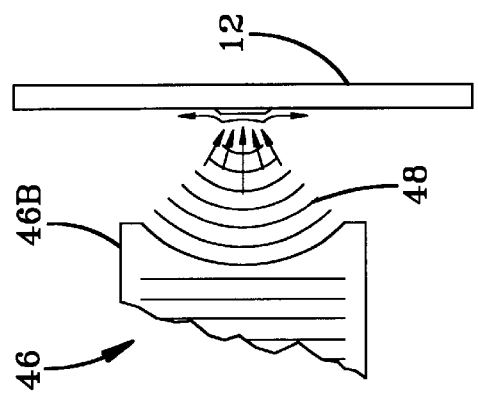
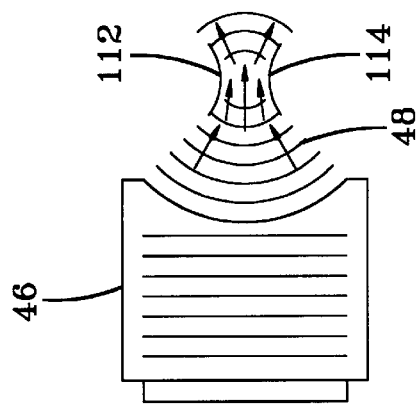
FIG-5(A)  FIG-5(B)  FIG-5(C)
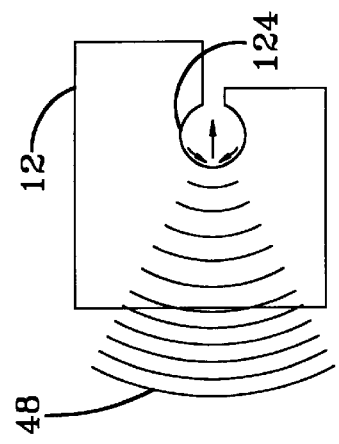
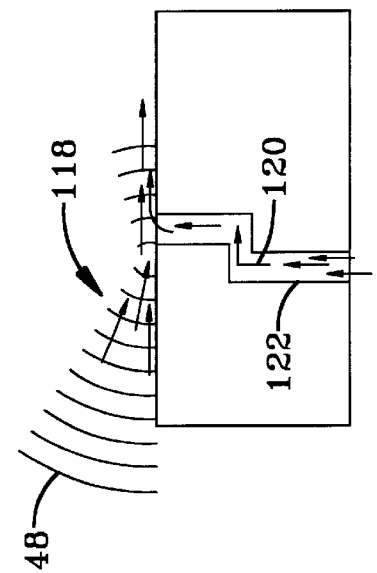
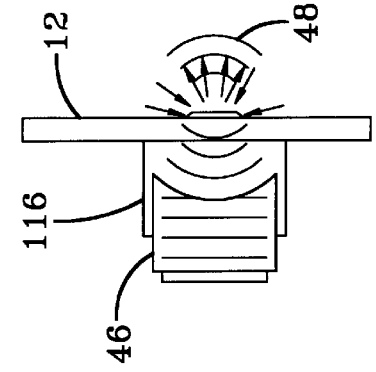
FIG-5(D)  FIG-5(E)  FIG-5(F)

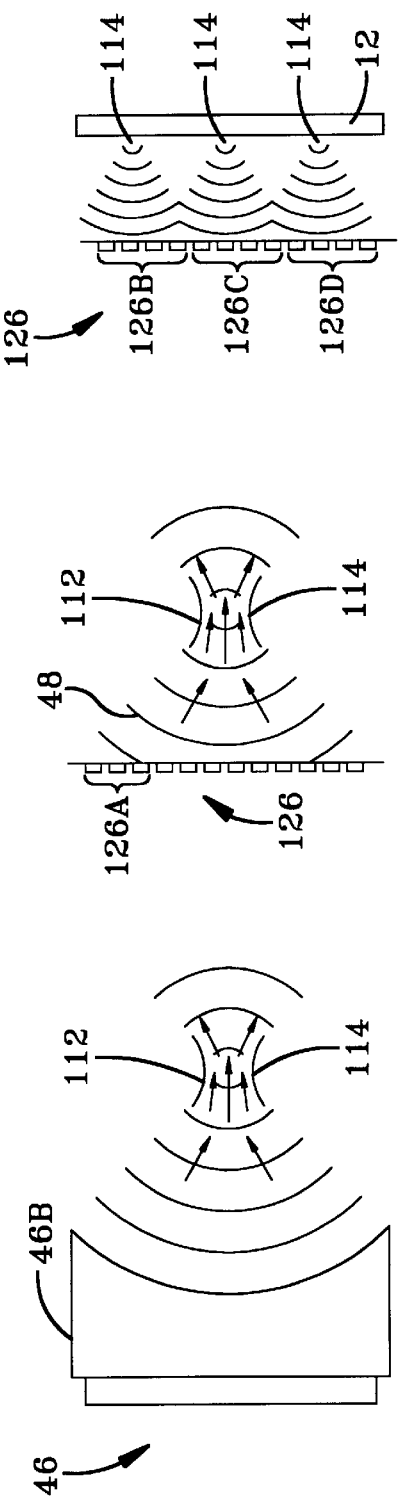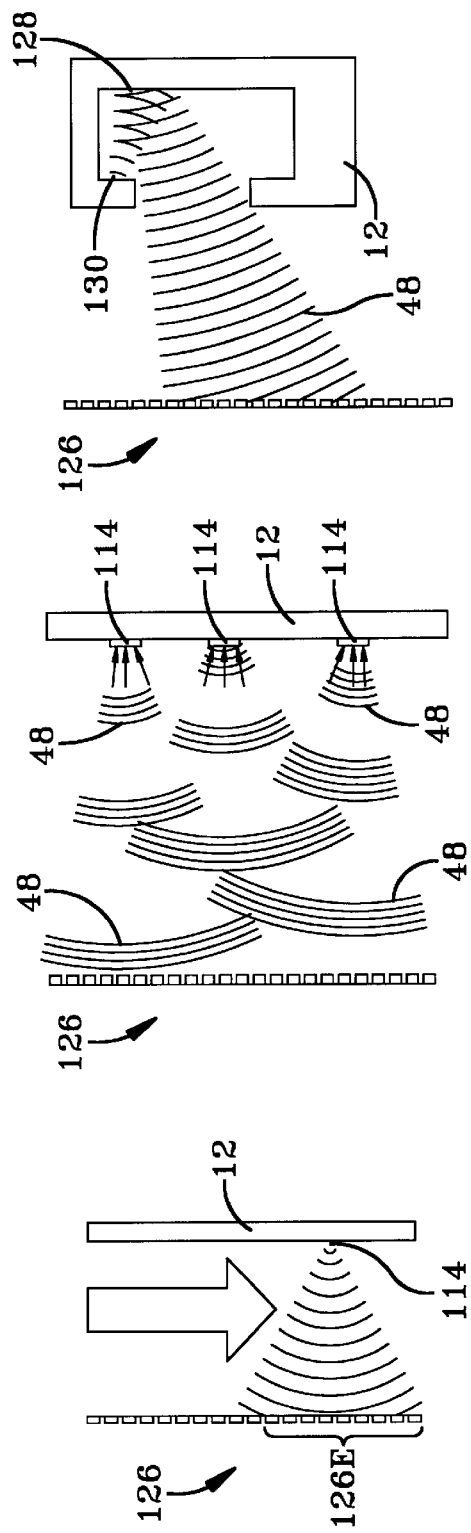

PLATING PROCESSES UTILIZING HIGH INTENSITY ACOUSTIC BEAMS

ORIGIN OF THE INVENTION

The invention described herein was made in the performance in work under a NASA contract and by an employee of The United States Government and is subject to the provisions of Section 305 of the National Aeronautics and Space Act of 1958, Public Law 85-568(72 Stat 435; 42 U.S.C. 2457), and may be manufactured and used by or for the Government for governmental purposes without the payment of any royalties thereon or therefor.

TECHNICAL FIELD

This invention relates to plating processes and, more particularly, to selected plating processes each of which utilizes directed beams of high intensity acoustic waves to create non-linear effects that alter and improve each of the plating processes.

BACKGROUND OF THE ART

The plating of objects, such as circuit boards, may be accomplished by various processes. One such process is an immersion type of selective electroplating that involves a tank filled with plating solution or electrolyte. Electrodes are placed in the tank, sometimes referred to as a plating bath, and a voltage is applied to the electrodes to set up an electric field in the tank. A power supply that has a variable voltage and amperage control is used to create the voltage between the electrodes. One electrode, called the anode, is attached to the positive terminal of a power supply. The other electrode, called the cathode, is attached to the negative or ground terminal of the power supply. The object to be plated is connected to the negative side of the power supply and, in effect, the object becomes the cathode side of the circuit. The plating material will deposit on the cathode side of the circuit.

The electrolyte consists of a chemical solution where the plating material, usually a metal, is dissolved and suspended in the liquid as metal ions. When the electric field is applied, the metal ions deposit on the cathode increase in thickness over time until the process is halted or the solution is exhausted. If the liquid is quiescent with no liquid currents or agitation, the electrolyte in the liquid layer immediately adjacent to the plated surface will become depleted of ions. The rate of metal ion deposition will slow down by an order of magnitude unless the electrolyte is agitated or some other means is used to deliver fresh electrolyte. Agitation is also used to dislodge and sweep away bubbles that sometimes form on the plating surface. The bubbles, typically hydrogen, form as a consequence of the deposition process and the bubbles will obstruct plating and create pinholes and non-uniform thickness in the plating.

Uneven distribution of plating is most often due to localized variations of electric field intensity. The variation is further exacerbated when objects have features with sharp edges or thin conductive paths created during the plating process and coexisting with large planar areas of the objects being plated. Plating in the large areas of the objects may be a fraction of the thickness of that on the narrow paths of the objects. Manipulation of the anode position and variations in anode shape are used to minimize the effect by redistributing the electric fields. Special tanks and customized anodes may be needed which disadvantageously raises the tooling cost to perform the plating. For complex objects, rotation assemblies and complex tumbling schemes may be required. In many cases the simplest solution is to plate the object until the thinnest area meets the minimum thickness required. This means that excess material will be applied to most other locations. This practice is particularly costly for precious metal plating.

Another disadvantage occurring in prior art electroplating is that as plating takes place the plating solution is continuously creating concentration gradients. For simple flat objects agitation works well. For complex objects with isolated cavities simple agitation cannot provide complete uniformity. Another disadvantage is that the formation of hydrogen or oxygen gas is a byproduct of the process. Again, agitation helps suppress formation and dislodge bubbles. Unfortunately, for complex objects the bubbles dislodged in one location may be trapped in another location.

A "mask" is typically used in electroplating to cover surface areas that are not intended to be plated. The mask may be a simple water-proof adhesive tape applied manually. It may also be a solid rubber mask held in place mechanically. Most commonly, a photolithographic technique is used where a light sensitive liquid hydrocarbon, called a photoresist, is applied as a coating. A photo tool similar to a photographic negative is used to define the shape of the mask by blocking light in some areas and transmitting light in others. The photoresist liquid solidifies when it is exposed to light while the unexposed photoresist remains liquid. The unsolidified liquid is removed and the remaining solid photoresist forms a mask that protects the coated areas from the plating process.

A simple tape mask is applied manually and can be very labor intensive, but suitable for low volume production or repairs. The typical photolithographic or photomask is suitable for high volume but requires a photo tool to be used which is costly to produce. If a change to the pattern is needed, the phototool is discarded and a new one is made. Some masking chemicals are toxic, carcinogenic or create compounds that are toxic. The materials are applied, exposed and developed and later stripped. Each stage creates waste that may be toxic and poses special handling and disposal costs. The light sensitivity of the photomasks, like film, implies special handling and storage facilities. The photomasks also have a limited shelf life. The material may be wasted even before it is used due to inadvertent exposure to light or heat and the simple degradation in storage. The new aqueous materials are more acceptable from a health consideration but they are not as sturdy as hydrocarbon types. For example, these aqueous masks are resistant to acid solutions but are dissolved by basic solutions thus, there is an inherent sensitivity to plating pH value. When the plating solution deposits the metal, it also becomes more basic and in some cases will attack the photomask and ultimately result in a flawed or damaged product.

The electroplating process may be enhanced by a periodic reversal of the plating voltage known as a "pulse plating" process in the prior art. The objective is to periodically reverse the voltage of the plating process so that the metal previously deposited is now extracted. The extraction rate is highest around features of objects being plated that have sharp or narrow geometry where electric fields are strong due to edge effects. The high extraction rate counteracts the excessive deposits caused by the same edge effects during the plating process. One of the main disadvantages of pulse plating is that it only reverses the process and there is a slight difference between deposition rate and extraction rate which may lead to non-uniform thickness of the plating.

Another process for performing plating is autocatalytic plating, most often called "electroless plating", and may be used to plate nonconductive surfaces where electroplating does not work well. The electroless plating does not rely on electric fields and therefore is harder to regulate. Typically this process may be used for plating nonconductive surfaces such as plastics and ceramics. The electroless plating is typically used to plate the holes in circuit boards so as to provide a conductive electrical path thereon. In some applications of electroless plating, a base of conductive metal plating is applied by electroless means and then the object is moved to an electroplating process for greater speed and control. Masking is somewhat critical for selective electroless plating because this process does not depend on the pattern of the conductive substrate to define the deposit pattern thereon. Since electroless plating does not rely on externally applied electric fields, it is harder for the user to regulate the process. Unlike electroplating the electroless plating process cannot be easily turned "ON" and "OFF" by application of electric power. For objects, such as electronic circuit boards, the failure of a mask will cause insulator surfaces to become conductive which may disadvantageously lead to short circuits.

A further process used to perform plating is brush plating. Brush plating is a selective electroplating process that is usually done by hand and thus is used mostly for repairs, very low production volume or plating in the field due to the limited provisions needed. A "brush" is a hand held anode with a porous wrap of cloth, sponge, cotton or other material that may be swabbed or brushed along a surface. Like immersion plating the process will place a positive voltage on the brush and a negative or ground on the object being plated. The brush may be a simple swab saturated liquid electrolyte or it may be connected to a pumped electrolyte supply. The advantages of brush plating are the low cost of equipment, little or no masking, and the ability to make quick repairs. However, this process is prone to spills and brings the user in close contact with corrosive, reactive and even toxic materials. The manual application disadvantageously requires a skill to achieve uniform and consistent results and also masking is often required.

A still further process used for performing plating is jet plating. Jet plating uses a liquid jet emitted by nozzles and aimed at a target object. A jet is a continuous free stream where the liquid remains continuous until it impinges on the part. The continuous stream will support an electric current and thus can be used for electroplating. Plating occurs only in the areas wetted by the jet of liquid. Because of the difficulty controlling the behavior of the liquid once it contacts the surface, the process normally requires a mask for selective plating. Jet spraying that creates the free stream jet of liquid plating solution undesirably requires pumps and nozzles that resist corrosive and reactive chemicals. This process also disadvantageously requires masking for selective plating.

An additional process used to perform plating is spray plating. Spray plating uses a nozzle to atomize or break a liquid stream into droplets that then impinge on the object to be plated. The isolated droplets may be charged, but will not sustain a continuous current between the source and the object. This process is generally used for electroless plating. The process has the advantage of controlling the distribution and thickness in a manner similar to spray painting used, for example, for automobiles. However, masking is disadvantageously required for selective plating. Further, the atomization process creates a mist of toxic, corrosive or reactive material that may coat other objects and may be inhaled by workers.

It is desired that a plating process be provided that does not suffer the drawbacks of the prior art plating processes, while at the same time providing improvements over each of the prior art plating processes.

STATEMENT OF INVENTION

The invention is directed to a system and a method for improving selective plating processes by using direct beams of high intensity acoustic waves to create non-linear effects for improving the plating process. The invention improves selective plating of a surface on an object which in one embodiment is immersed in a plating solution, and in another embodiment is suspended above the plating solution.

The system comprises a container, a source of radio frequency (RF), and a transducer. The container holds the plating solution in which is lodged an anode and cathode electrode connected to respective electroplating voltages and with the cathode electrode connected to the object to be plated. The container has means for holding an object at least near or submerged in the plating solution. The transducer receives the output of the RF source and develops an output beam of acoustic waves that are directed at least near the object.

BRIEF DESCRIPTION OF THE DRAWINGS

FIG. 3 is composed of FIGS. 3(A), 3(B), and 3(C) and that illustrates various features of different embodiments of the present invention;

FIGS. 5(A), 5(B), 5(C), 5(D), 5(E), and 5(F) illustrate some of the acoustical effects involved in the practice of the present invention;

FIGS. 6(A), 6(B), 6(C), 6(D), 6(E), and 6(F) illustrate some of the acoustic beam formations involved in the practice of the present invention;

DETAILED DESCRIPTION OF THE INVENTION

Figure 1:
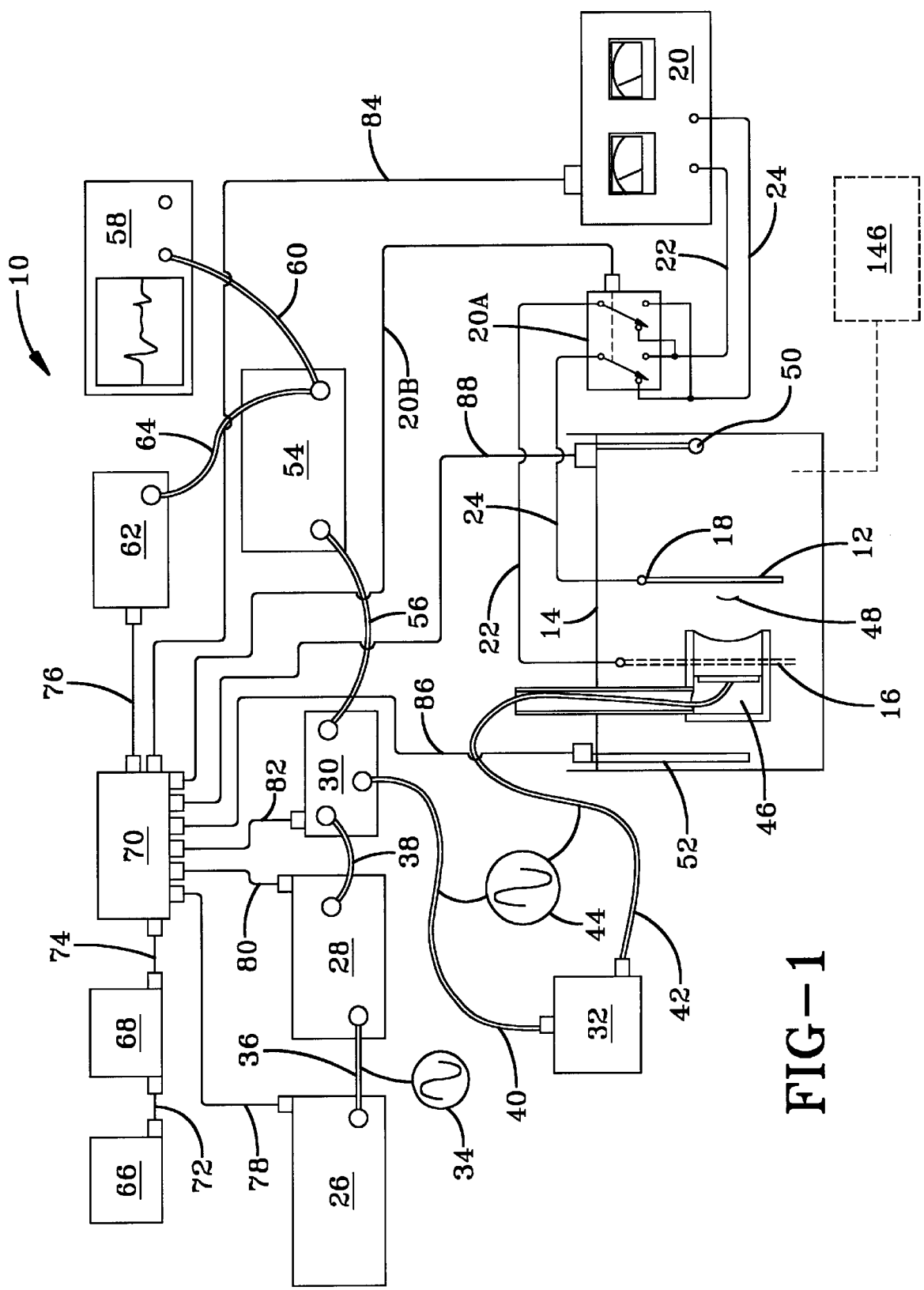
FIG. 1 is a block diagram of the system of the present invention.

Referring to the drawings, wherein the same reference number indicates the same element throughout, there is shown in FIG. 1 a block diagram of the system 10 used for plating objects 12. The system 10 comprises a container 14 holding a plating solution and in which is lodged and an anode grid 16 and a cathode connection 18 both connected to a plating power supply 20 respectively by cables 22 and 24. The system 10 further comprises a switch (DPDT) 20A for switching or reversing the polarity being respectively carried by cables 22 and 24 so that the polarity of the potentials applied to the object 12 is reversed in a manner to be further described hereinafter. Further, the switch 20A has a cable 20B connected to the data acquisition and control interface 70 also to be described hereinafter. A portion of the object 12 to be plated is connected to the cathode connection 18.

A source of radio frequency (RF) is provided by a RF signal generator (with burst mode) 26, an RF amplifier 28, preferably an RF switch 30, and a impedance matching network 32. The RF generator 26, the RF amplifier 28, and impedance matching network 32, as well as the other elements shown in FIG. 1, are of existing commercially available equipment. The RF signal generator 26 preferably provides high frequency signals generally in the range from about 1 MHZ to above 100 MHZ. The use of frequencies above 100 MHZ allows for the capability to focus the acoustic beam 48 on fine details (<0.001 inch) so as to perform plating at a micro circuit scale. The RF signal generator 26 provides a relatively low power output RF signal 34 carried by cable 36 which is routed to the RF amplifier 28 which, in turn, provides an output signal carried by cable 38 to the RF switch 30, which, in turn, provides an output signal to the impedance matching network by way of cable 40.

The RF impedance network 32 receives on cable 40 and transmits on cable 42 a relatively high power RF signal 44. Cable 42 is routed to a acoustic transducer 46 which develops an output beam of acoustic waves, one of which wave 48 is shown within the confines of the container 14. For the sake of clarity, reflected acoustic waves are not shown in FIG. 1. As used herein, the reference number 48 may be used to identify a single pulse, multiple signals or beam patterns. Also shown within the confines of the container 14, is a temperature probe 50 and a liquid level probe 52.

A pulser/receiver 54 is connected to the RF switch 30 by way of cable 56. The pulser/receiver 54 is also connected to an oscilloscope 58 by way of cable 60 and to an RF peak detector 62 by way of cable 64.

The system 10 preferably further comprises a user interface 66, a plating system control computer 68, and a data acquisition and control interface 70. The user interface 66 is connected to the plating system control computer 68 by way of cable 72, whereas the plating system control computer 68 is connected to the data acquisition and control interface 70 by way of cable 74. The data acquisition and control interface 70 is connected to the RF peak detector 62 by way of cable 76.

The data acquisition and control interface 70 has cables 78, 80, 82, 84, 86, 88 and 20B that are respectively connected to the RF signal generator 26, the RF amplifier 28, the RF switch 30, the plating power supply 20, the liquid level probe 52, the temperature probe 50 and the reversing switch 20A.

The RF signal generator 26 is the source of the high frequency signal that drives the transducer 46. It is preferred that the RF signal generator 26 have signal frequency control, voltage level control and control of waveform. The practice of the invention employs, in addition to other, burst modulation, as well as amplitude modulation features of the RF signal generator 26. If the RF signal generator 26 does not have a "Burst Model" available, then a gated mode may be used where a second signal generator is used to trigger the first in a manner known in the art.

The RF amplifier 28 is used to amplify the signal provided by the RF signal generator 26. The RF amplifier 28 is typically a "Class A" type amplifier that provides full wave amplification. The RF amplifier 28 boosts the power of the RF signal generator 26 up to a wattage that is suitable for driving an acoustic device 46. Amplifier gain ratios may range from 100 to 100,000. The maximum power may range from less than 1 watt to 100 watts depending on transducer size, duty cycle and beam 48 focus gain. The output impedance of the RF amplifier 28 is generally 50 ohms which is the industry standard for high power RF systems and their components.

The RF impedance matching network 32 is preferably used because the transducer 46 may inherently have an impedance higher than 50 ohm and it is desired to provide an intermediate circuit that matches the impedance of the transducer 46 to the RF amplifier 28. Because the intervening cables 40 and 42 are usually 50 ohm also, the impedance matching network 32 is mounted as close as possible to the transducer 46.

The majority of connections, shown in FIG. 1, are through 50 ohm coaxial cables. The type of cable may vary depending on the overall power level and the voltage anticipated for its application. Because the cables are conductive and may degrade in the harsh chemical environment, the cables within the plating bath 14 should be shielded from an electrolyte by a chemically compatible pipe or tube in a manner to be described hereinafter with reference to FIG. 3(A).

The pulser/receiver 54 can be used in the present invention as part of an acoustic sensing or imaging system. Unlike other devices, the pulser/receiver 54 may be used to both emit and receive pulses. The pulser portion of the pulser/receiver 54 emits a high voltage pulse on the cable 56 leading to the transducer 46 so as to drive or cause the transducer to develop a corresponding output acoustic pulse, such as pulse 48. The pulser/receiver 54 may be immediately switched to a "receive" mode where sensitive amplifier circuits thereof sense the reflected electrical signal that corresponds to a reflected or echo pulse received by the transducer 46 in a manner as to be described hereinafter with reference of FIG. 2. The pulser/receiver 54 is intended to operate in conjunction with a signal analysis device, such as the oscilloscope 58, to examine the relationship of the initial pulse and the reflected pulse. A variable gain or attenuation selector is typically provided on the pulser/receiver 54 to adjust the sensitivity and to provide electrical noise suppression. The signal received by the pulser/receiver 54 may be routed to an analysis device, such as the oscilloscope 58, where time and amplitude may be measured in a manner as also to be further described hereinafter with reference to FIG. 2.

The RF peak detector 62 is typically used with the pulser/receiver 54. The RF peak detector 62 converts the pulse, burst or continuous signal into a dc voltage level that corresponds to the peak voltage detected within a predetermined time increment. This conversion makes it easier for a computerized or automatic control system, such as the plating system control computer 68, to measure the signal values. Typically, this analog to digital conversion is used to measure the time delay and strength of the reflected wave which, in turn, is used to determine the position and reflection properties of the reflecting surface of the object 12 being plated.

The plating system control computer 68 may be a simple controller with simple interface and control functions. The plating system control computer 68 may also be a computer with appropriate software and hardware to provide to acquire measurements, convert measurements to digital data, process and display data, and also perform process control functions.

The system 10 of FIG. 1 may be managed by a computer control system, such as the plating system control computer 68, that commands the process, acquires measurements from instruments shown in FIG. 1, and regulates the plating process being performed. The user interface 66 may consist of a display device and or printer for displaying system 10 information for the user supervising the plating process. The user interface 66 may also consist of a keyboard and pointing device and buttons for entering commands and setting parameters associated with the process being performed. The plating system control computer 68 may be used to input and store plating system configuration information such as timing of process devices, setting power levels associated with the RF generator 26, setting acoustic signal parameters associated with the transducer 46 and other system limits.

The data acquisition and control interface 70 converts normal computer digital control and data information into signals that are compatible with the other devices under its control. The data acquisition and control interface 70 also receives signals and data from these devices and converts the signals into digital signals to be used by the computer of the plating system control computer 68. A portion may be used for converting signals from analog to digital (A/D) format or from digital to analog (D/A) format. The data acquisition and control interface 70 may use means for converting different digital signal formats from one type to another. Any of a number of available data and communication protocols, known in the art, may be used.

The RF signal generator 26 provides the reference signals used by the acoustic devices, such as the transducer 46. A commercially available RF generator preferably creates a high frequency signal as a continuous wave, single pulse, or burst signal. The output signal needs to be compatible with the input of the RF amplifier 28.

If the RF amplifier 28 output shares a signal conductor with a feedback portion of the system, such as that routed to the pulser/receiver 54, the use of the RF switch device 30 is preferred. This RF switch device 30 is one possible means of isolating the RF power side from the acoustic sensing and feedback side to the system. This RF switch device 30 prevents the sensing side, such as that associated with the pulser/receiver 54, from being damaged by high voltage RF signals.

In a manner as previously mentioned, most commercially available RF Systems, such as RF generator 26, are designed to use 50 ohm impedance transmission devices and cables. Most acoustic devices, such as transducer 46, in the ultrasonic range have much higher impedance, greater than 50 ohms, over their operating range. Therefore, for efficient power transmission an impedance matching circuit 32 is preferably used. The impedance from one level, such as 50 Ω, is converted to another level, such as greater than 50 Ω. The high impedance side of the impedance matching network 32 is used to drive the acoustic transducer 46.

The present invention, in a manner to be further described hereinafter, operates with and without an electroplating process and if the plating is an electroplating process, then a plating power supply 20 is used to provide the electric field voltage and to maintain the amperage for the electroplating process. A simple power supply with external meters and automatic regulation may be employed. The plating power supply 20, along with the polarity switch 20A, may also be controlled remotely by the plating system control computer 68 using an industry standard control interface and protocol, in a manner known in the art.

The present invention, in a manner to be further described hereinafter, operates with the object 12 suspended above a plating solution or with the object 12 immersed in a plating solution and both may use the plating bath 14. The means for positioning the object 12 in suspended or immersed manner is conventional and known in the art. A container, tank, or vessel 14 containing the plating electrolyte liquid is often referred to as a "plating bath". The term "plating bath chemistry" refers to the chemical composition of the electrolyte liquid. The plating bath 14 usually consists of a non-metallic container that supports the liquid and provides sufficient volume to contain the plated objects 12 and sufficient plating electrolyte to fully plate the objects 12 without exhausting the liquid plating solution. During the performance of plating processes, it may be necessary to refresh or renew the electrolyte plating solution and maintain a specific bath chemistry. A supply and drain may be used to tap off spent or contaminated solution while new plating solution is added. Alternatively, a means of adding and dissolving the plating metal or metal salt may be used to refresh the tank 14. The plating chemistry may be maintained by empirical techniques, such as by tracking the number of objects 12 plated. A manual or automatic sample and analysis may also be used to monitor and control the plating bath chemistry in a manner known in the art.

For supporting an alternate embodiment of the present invention referred to herein as "acoustic fountain plating", to be further described hereinafter with reference to FIGS. 8 and 9, associated with suspending the object 12, a modified bath 14 may be used. The volume of the tank need not support immersed objects 12 since the objects are suspended above the liquid surface in a manner known in the art. The volume of the tank 14 need only be sufficient to permit the acoustic fountain plating to form without significantly altering the level of the plating liquid solution. A relatively shallow pool is needed to cover the transducers, such as transducer 46, and permit a beam to focus at that surface of the plating solution to create the fountain. The pool needed for the acoustic fountain plating may be connected to a larger system that refreshes the bath chemistry and maintains pool level. For both types of electroplating, that is one in which object 12 is immersed in a plating solution and one in which the object 12 is suspended from the plating solution, the anode 16 provides positive side of the electroplating process. The electrons involved in the plating processes will move toward and collect on this electrode 16. The cathode or ground connection 18 provides the negative side of the circuit where the plating ions will deposit. The portion of the object 12 to be plated is connected to the cathode lead 18 and, therefore, represents the cathode in the circuit. The plating power supply 20 is usually a DC voltage supply that regulates the voltage and amperage based on the user's settings known in the art. The voltage and amperage limits may be controlled independently. The plating power supply 20 will typically provide meters for monitoring voltage and amperage meters for process monitoring. The monitoring of the output signal of the RF signal generator 26 may be described with reference to FIG. 2.

Figure 2:
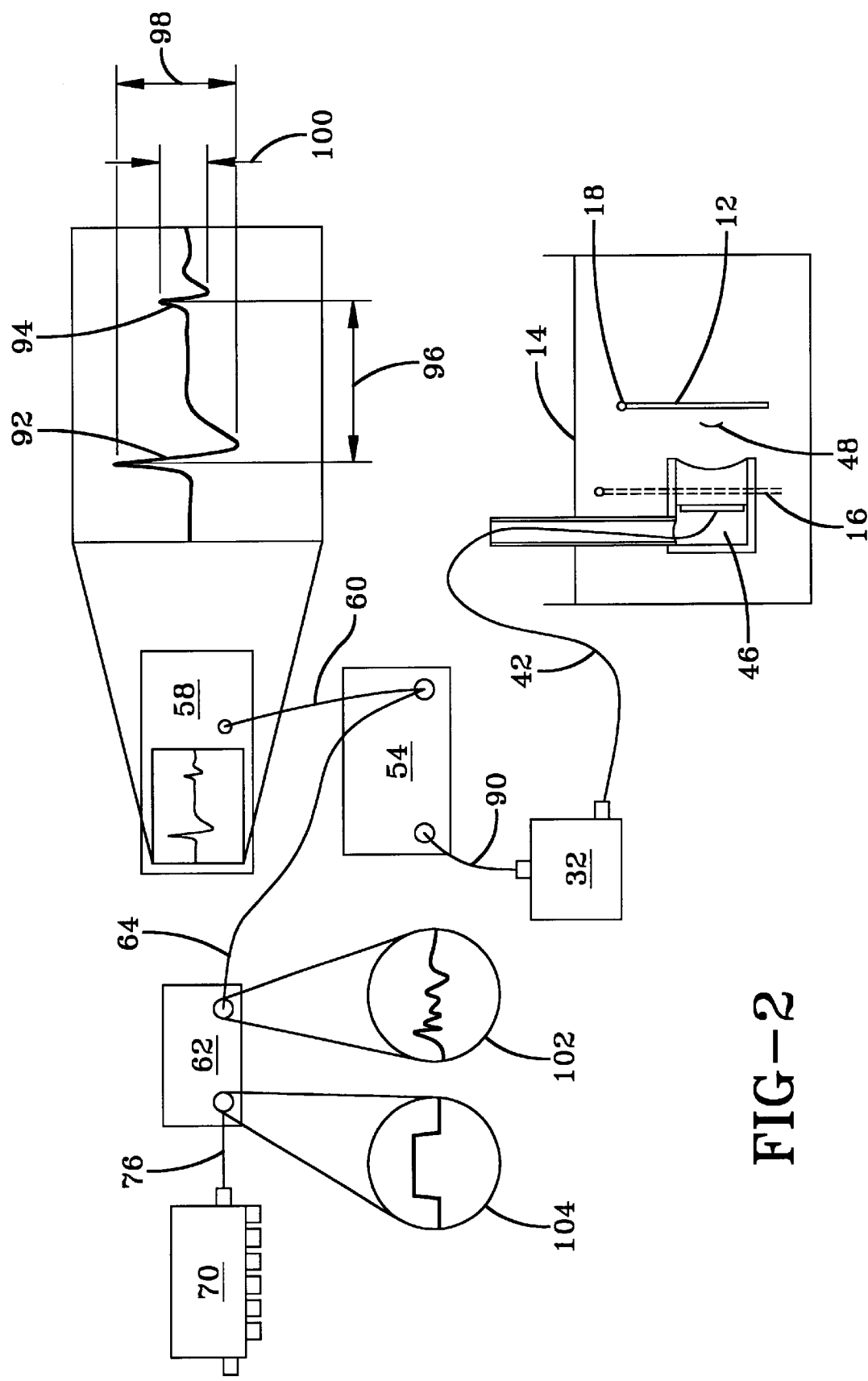
FIG. 2 is a block diagram showing a test setup for measuring some of the parameters involved in the practice of the present invention.

FIG. 2 is similar to FIG. 1, but is devoid of some of the elements shown in FIG. 1, such as the plating power supply 20 used in the plating processes. FIG. 2 also shows a cable 90 interconnecting the impedance matching network 32 and the pulser/receiver 54. To monitor the acoustic signal 48 of the system a RF coupler and preferably a bi-directional coupler is used and forms part of the pulser/receiver 54. The bi-directional coupler can be used to monitor a forward signal 92, shown in FIG. 2, and a reverse or reflected 94 signal also shown in FIG. 2. The time between the initial or forward signal 92 and the reflected signal 94 is shown as a duration 96, whereas the amplitudes of the signals 92 and 94 are shown by height 98 and 100 respectively. The forward and reverse sensors (not shown) of the pulser/receiver 54 are monitored through separate connectors. The device that monitors the signals may be a simple two-channel oscilloscope 56 previously discussed. Specialized RF power meters (not shown) that combine the coupler function and signal analyzing function are available commercially. The forward to reverse ratio will indicate how well the transducer 46 is matched to the RF source 26 (not shown in FIG. 2 nor is the RF amplifier 28). If the reverse signal 94 is near $\frac{1}{10}$ or less of the forward signal 92 then the transducer 46 is well matched to the RF amplifier 28 and the power transmission of the system 10 is considered efficient.

A feedback loop for the system 10 may be arranged by the pulser/receiver 54 shown in FIG. 1. To measure parameters such as those occurring by the present invention using pulse echo techniques, as to be further described hereinafter with reference to FIGS. 3–9, an RF switch 30 is temporarily switched to connect the sensing side (such as signals carried by cable 42) and isolate the RF power side (such as signals carried by cable 38 of FIG. 1 of the system 10). The pulser/receiver 54, in the pulser mode, emits a relatively high voltage pulse and causes the transducer 46 to emit a corresponding acoustic wave 48. The wave reflected back from the object 12 is received and converted back into an electrical signal by the piezoelectric effect inherent in the transducer 46. The pulser/receiver 54 senses the relatively weak reflected wave signal 94 and also filters and amplifies the reflected wave signal 94 as desired by the user. The reflected signal 94 may then be analyzed as an analog signal on an oscilloscope 56 or converted further for use by the data acquisition and control interface 70. The analog signal of FIG. 2 is generally indicated by reference number 102 and carried by cable 64, whereas the digital signal of FIG. 2 carried by cable 76, is generally indicated by reference number 104.

The system 10 may also use the RF peak detector 62 of FIG. 1 to convert the pulser/receiver 54 output into a DC voltage level that is easily measured by a computer control and data acquisition system 70. The system 10 may have other feedback instruments, such as temperature sensing provided by probe 50 and liquid level sensing provided by probe 52.

The practice of the present invention takes into account the characteristics of the acoustic transducer 46 and due to its piezoelectric nature the acoustic transducer 46 is capable of acting as a diagnostic and sensing instrument as well as an acoustic source.

For example, the pulser/receiver 54 is used in one embodiment to provide a pulse echo technique to accomplish plating of the object 12. The pulse echo technique, similar to sonar, can use the time interval between emitted 92 and reflected signal 94 to gage the distance between the object 12 and the acoustic transducer 46. This information may be used to verify that the object 12 is in its proper position to have successful plating placed therein or indicate that adjustments are required for proper performance of the plating operations of the present invention.

Another aspect, taken into account by the present invention, is the strength or magnitude of the reflected signal 94 when compared to the emitted signal 92. For example, different materials comprising the object 12 exhibit different reflection and transmission properties that are determined by analyzing the signals 92 and 94. Further, metal surface or subsurface features may be distinguished from plastic or ceramic materials by tracking the changes in reflected signal 94 strength.

The orientation of the object 12 also affects the reflection of the acoustic beam directed on or near the object 12 by the acoustic transducer 46. For example, an object 12 with an irregular or tilted surface will provide a reflected signal 94 that is different in strength and shape from that of a flat surface held perpendicular to the acoustic beam. Highly reflective and scattering type objects 12, as well as gas bubbles near the object 12, will provide distinct changes to the reflection signal 94. The reflection strength, the reflection time delay, and the shape of the reflected signal 94 will also reveal information about the surface of the object 12. The presence of multiple reflections manifested by multiple reflected signals 94, also indicate subsurface features of the object 12, such as hidden cavities.

An alternative to using a single acoustic transducer 46, such as that shown in FIG. 1, is to use a so called "through transmission technique," where one transducer 46 emits acoustic waves and a second transducer 46 on the opposite side of the object 12 receives the waves. The attenuation due to acoustic adsorption, scatter or reflection provides the user with a measure of the properties or features of the object 12 being plated.

The above techniques may be used to guide the process by locating the object 12 features, determining position and orientation of object 12 or features, and indicate the type of materials comprising the object 12. It may also be used to detect bubbles or other foreign bodies. Various embodiments using one acoustic transducer 46 may be further described with reference to FIGS. 3–9.

EMBODIMENTS OF THE INVENTION

FIG. 3(A) shows an immersion electroplating process enhanced by using acoustic waves in accordance with the practice of the present invention. An object 12 to be plated and a single physically focused transducer 46 is immersed in a plating tank 14 filled with a plating solution 108. The transducer 46 emits acoustic waves through a buffer 46A to a concave acoustic lens 46B. The beam of waves, generally identified by reference number 48, is focused at an area on the surface of the object 12. The object 12 shown is a simple flat panel of conductive or partially conductive material, such as a circuit board. A simple focused transducer 46 is shown, but a phased array or a plurality of transducers may also be used in a manner to be further described hereinafter with reference to FIG. 6. An electrical conductor 42, previously described in FIG. 1 as a coaxial cable, is connected to the back side of the transducer element 46C. The ground or return side of transducer 46 is connected to the ground or shield portion of the coaxial cable 42. The transducer 46 and conductor 42 are contained in a protective non-conductive conduit and housing 110. The conductor of cable 42 from the,acoustic transducer 46 is connected to a high power RF frequency signal source 26, more particularly, to the high power RF signal 44 as shown in FIG. 1. A set of plating electrodes (16 and 18) is also shown in FIGS. 1 and 3(A). A flat anode grid 16 is shown in FIG. 3(A) around the transducer 46 and represents the anode or positive side of the plating circuit. The object 12 panel or any other device to be plated, is grounded to the cathode 18 or negative side of the circuit. The conductive leads of cables 22 and 24, respectively from the anode grid 16 and the cathode 18, exit the tank 14 and are connected to the regulated plating power supply 20.

A simple method of using the transducer 46 is to submerge the transducer 46 in the plating bath 14 containing the plating solution 108 in a manner as shown in FIG. 3(A). To protect the transducer 46, it may be mounted in a waterproof housing made of a non-conductive material. The transducer 46 may also be mounted in the housing by potting it in an epoxy or similar material so as to provide both mechanical strength and sealing. The submerged transducer 46 may also be mounted to a fixed bracket or a motorized assembly that provides translation and rotation so that the transducer 46 may be moved around the tank 14 to access various locations on the object 12 to be plated.

FIG. 3(B) shows a similar arrangement as in FIG. 3(A). However, in FIG. 3(B) electrodes are not shown because this process is autocatalytic or electroless and does not rely on an external electric field created by the cathode/anode arrangement of FIGS. 1 and 3(A). The object 12 of FIG. 3(B) may or may not be electrically conductive. FIG. 3(B) shows the transducer 46 mounted in an immersible housing 14. An alternative is to mount the transducer 46 in the wall of the tank 14. Another alternative is to mount the transducer 46 outside the tank 14, but acoustically coupled with wall.

The source of the acoustic waves for the embodiments of FIGS. 3(A) and 3(B) is the acoustic transducer 46. The acoustic transducer 46 is normally constructed from a piezoelectric material. The transducer 46 converts electrical energy into acoustic energy.

The acoustic buffer 46A is used to conduct the acoustic energy from the transducer 46 into the medium. A buffer material is normally mated to the transducer surface. The buffer 46A is used for protection and may also serve as an impedance matching layer. The buffer 46A also isolates the transducer and its electrical signal from the electrolyte, thus, preventing electrical shorts and protecting it from harsh chemicals.

The lens 46B is frequently used to focus the waves in the liquid 108. The lens 46B may be bonded to the buffer, but more commonly, the buffer 46A itself may be shaped into a lens 46B. The use of a lens 46B allows the acoustic waves to be generated with relatively low intensity, which reduces the stress on the transducer 46. The focusing also allows the acoustic waves to pass through the liquid 108 at low intensity initially and minimize the disturbance to the liquid 108 and the attenuation of the acoustic beam 48. The high intensity is achieved at the focal zone of the lens 46C where the effects of acoustic streaming, acoustic radiation pressure and acoustic heating are substantial. The lens 46B may be spherically concave, but cylindrical lenses, fresnel lenses and similar focusing schemes may be employed.

The operation of the transducer 46 may be enhanced by providing cooling means to keep the transducer from overheating. The cooling means (not shown) may be a simple hose and air nozzle blowing air on the back of the transducer 46.

The means of connecting the transducer 46 to the buffer or lens may vary and typically comprises an acoustic bonding layer. Aside from the need for a structural mount, the transducer 46 needs to couple the acoustic waves with the buffer 46A or lens 46B without significant loss or refection. Thinner bond layers permit more efficient transmission. A bond thickness of less that $1/100$ of a wavelength is regarded as having a negligible effect on transmission. A simple adhesive or epoxy bond is suitable for most frequencies up to a few megahertz. In some instances, the two components may be held together mechanically and a thin liquid layer between the two is used to assure coupling. For frequencies of 100 MHz or higher a metal bond such as indium cold welding is more suitable. Acoustic transmission is most efficient when the (characteristic) acoustic impedance of the transducer matches that of the transmitting medium. Unfortunately, the materials typically used to produce ultrasonic waves are poorly matched to the liquid plating solution 108. The common practice is to use an "impedance matching layer". Ideally, the impedance matching layer has a characteristic impedance that is the geometric mean of the two materials. The match is further improved when the thickness of the layer is equal to ¼ the acoustic wavelength.

FIG. 3(C) shows an acoustic fountain plating configuration serving as one embodiment of the present invention which is to be further discussed hereinafter with reference to FIGS. 8 and 9. The object 12 to be plated is suspended above the pool of plating solution 108 contained by a plating tank 14 in a manner known in the art. The object 12 shown is a simple flat panel, but other shapes may be used. The process may operate as electroplating or electroless plating. A transducer 46 is mounted below the free surface of the pool 108. The beam of acoustic waves 48 is focused at the surface of the object 12 to create a fountain. The fountain is shown making contact with the suspended object 12. The transducer 46 may be housed in an immersible housing as in FIGS. 3(A) and 3(B), or it may be mounted to the bottom of the tank 14. Further details of transducer 46 may be further described with reference to FIG. 4.

Figure 4A:
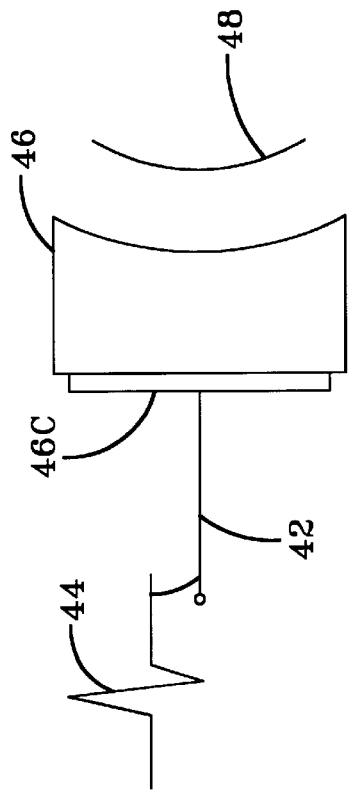
FIGS. 4(A), 4(B), and 4(C) illustrate some of the acoustical waveforms associated with the practice of the present invention.
Figure 4B:
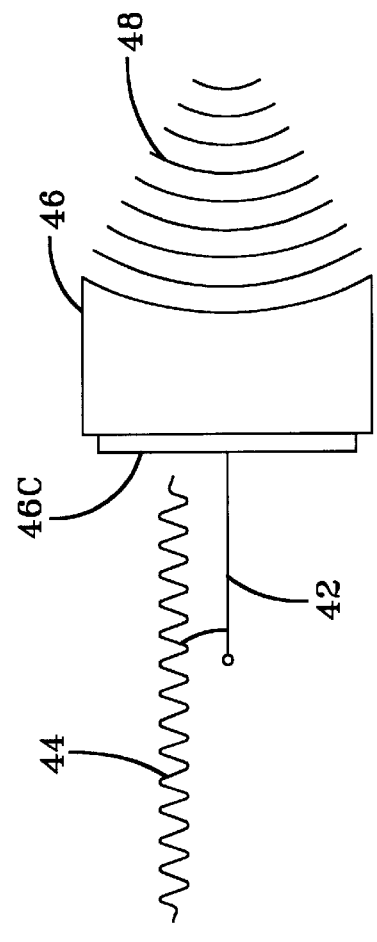
Figure 4C:
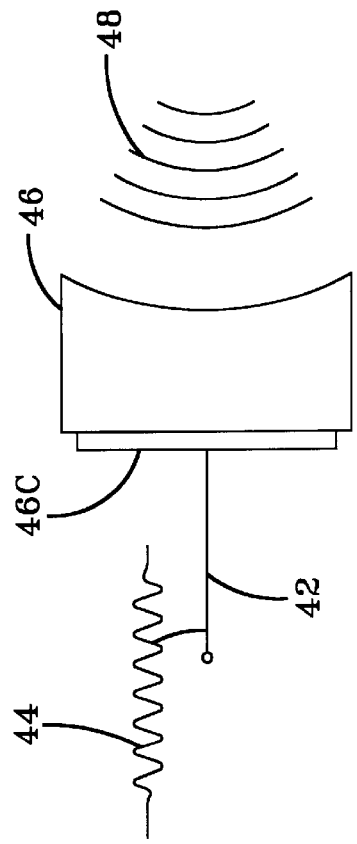

FIG. 4 is composed of FIGS. 4(A), 4(B), and 4(C) and illustrates the type of RF signals 44 applied to the transducer 46 and corresponding acoustic waves 48. FIG. 4(A) shows a single electrical pulse 44 and a single pulse acoustic wave 48. FIG. 4(B) shows a continuous sine wave signal 44 and a corresponding continuous acoustic wave 48. FIG. 4(C) shows an electrical tone burst comprising signal 44 and a corresponding tone burst of acoustic waves 48. The acoustic effects utilized by the present invention may be further described with reference to FIG. 5.

FIG. 5 is composed of FIGS. 5(A), 5(B), 5(C), 5(D), 5(E), and 5(F). The reflected waves are not shown in FIG. 5 for the sake of clarity. FIG. 5(A) shows a simple focused transducer 46 creating both acoustic streaming and acoustic heating, generally indicated by reference number 112 and to be further described hereinafter, at a focal zone 114 where the acoustic intensity is highest and is created by the directed beam 48.

FIG. 5(B) shows a focusing lens 46B used to selectively enhance the plating at the focal zone 114 (not shown) created by the beam 48. FIG. 5(C) shows the plating created by the beam 48 directed on the front side of the object 12, transmitting through the object 12 and emitting out the back side of the object 12. The embodiment of FIG. 5(C) selectively enhances plated areas of the object 12 on both the front and backside thereof. Unlike FIG. 5(B), where the object 12 is assumed to be either acoustically reflective or which absorb acoustic waves, the embodiment of FIG. 5(C) assumes that the object 12 has high acoustic transmission efficiency.

FIG. 5(D) shows a transducer 46 physically coupled by direct contact to the first surface of an object 12 by means of a solid conductor 116. The acoustic waves 48 are transmitted from the lens 46C to the conductor material of the conductor 116 and to the object 12 in contact with the conductor 116. The acoustic waves 48 transmit through the object 12 and are emitted from the back side of the object 12, where acoustic streaming, to be further described hereinafter, and heating may selectively enhance the plating rate embodiment of FIG. 5(D). The materials of the object 12 for this embodiment of FIG. 5(D) are assumed to have high transmission efficiency.

FIG. 5(E) shows an acoustic beam 48 (from any arbitrary source) arranged so that it grazes the portion of the surface of the object 12, thus, creating acoustic streaming, generally indicated by reference number 118, which is parallel to the surface as shown in FIG. 5(E). As used herein, acoustic streaming is meant to represent the condition that is used to create a liquid current that provides fresh plating to the surface of an object 12 being plated and that is in acoustic beam 48 path. The streaming liquid flows indicated by directional arrows 118 across an open passage 122. More particularly, a Bernoulli effect of the streaming liquid flow causes a drop in pressure across the open passage 122 and induces a liquid flow 120 through and out the open passage 122. The induced liquid flow may be used to increase the plating on the walls of the open passage 122.

FIG. 5(F) shows acoustic waves 48 transmitting into a solid object 12 and encountering an internal cavity 124 or passage. The beam 48 may be focused on the cavity 124 so that streaming and acoustic heating is induced. This embodiment of FIG. 5(F) may be used to selectively increase the plating rate of a surface of the cavity.

The acoustic beam formation and manipulation thereof practiced by the present invention may be further described with reference to FIG. 6 which is composed of FIGS. 6(A), 6(B), 6(C), 6(D), 6(E), and 6(F).

FIG. 6(A) shows a simple focused acoustic transducer 46 employing an acoustic lens 46B to produce a high intensity zone 114 along with acoustic streaming and heating 112.

FIG. 6(B) shows an alternate embodiment of an acoustic transducer 46 using an acoustic phased array 126 made up of a plurality of elements 126A that are independently driven, but commonly controlled to produce a high intensity zone 114 along with acoustic streaming and heating 112.

In addition to the transducers 46, an array of transducers 126 may be used whenever using many small elements is less expensive than building or using a large element. A simple array may also be driven by separate amplifier circuits which are coordinated by a single signal source. In some plating systems, objects 12 move along in a conveyorized production line. An array that operates in a time sequence can be used to track an object and keep the acoustic beam 48 acting on a fixed location on that object 12 without requiring the conveyor line to stop. A similar application is to use array elements to act in a predetermined pattern to create specific plating patterns much like the array of dot elements in a matrix or ink jet printer.

With regard to the phased array 126A a method of focusing that uses electronic control rather than physical lenses is the acoustic phased array. The acoustic phased array 126 is now common for medical ultrasound imaging. An array of many independently controlled and powered elements emits small acoustic waves (wavelets). The emission of these wavelets is controlled in terms of time shift or phase shift. The wavelets overlap and both constructively and destructively interfere, forming a beam of waves made up of the coalesced wavelets. The manipulation of the wavelet phase shift provides the ability to steer and focus the beam 48 electronically. This capability further permits the user to change the direction and focus of the beam rapidly with no moving parts. The acoustic phased array may move the beam or hop so rapidly that, to an observer, it appears as multiple beams focused at multiple targets.

FIG. 6(C) shows an acoustic phased array 126 that is segmented into sub arrays 126B, 126C, and 126D to produce a plurality of high intensity zones 114. FIG. 6(D) shows an acoustic phased array 126 where subset 126E of elements produces a single high intensity zone 114. The element's phase relationship is laterally shifted producing a laterally progressing focal zone. This embodiment of the invention may be used to move the area of increased plating along a part surface to create a stripe of plating.

FIG. 6(E) shows an acoustic phased array 126 operating in beam hopping mode where the focal zone 114 is rapidly moved between multiple points along the object 12 at a high rate. The hopping pattern repeats at a high rate so that the process appears to be acting on multiple points at once.

FIG. 6(F) shows a beam being reflected from a first surface 128 of object 12 encountered and focused on a second surface 130 of object 12 where the intensity is high enough to selectively increase the plating rate. This embodiment of the invention may be used to act on a surface that is not line of sight from the acoustic source or sources.

Further embodiments of electroplating included in the present invention using acoustic effects and voltage reversals may be further described with reference to FIG. 7 which is composed of FIGS. 7(A), 7(B), and 7(C).

Figure 7A:
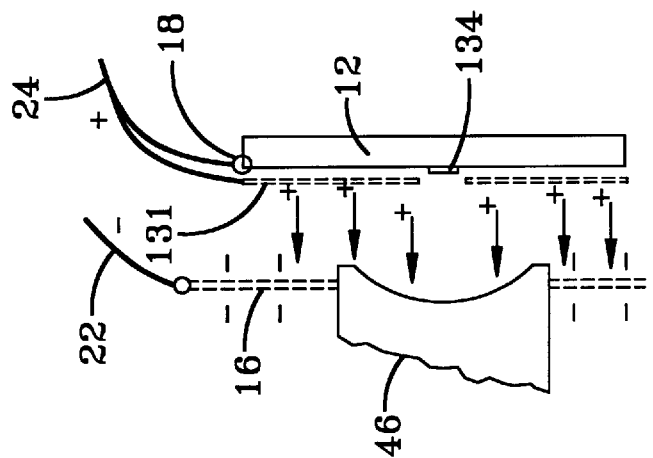
FIGS. 7(A), 7(B), and 7(C) illustrate a plating process of the present invention using acoustic effects created by voltage reversals of the electroplating potentials associated with the present invention.

FIG. 7(A) shows the configuration for creating a depleted layer 132 around the object 12. The transducer 46 is not operating while electrical power is applied to the anode/cathode pair shown as cables 22 and 24, respectively. FIG. 7(A) further illustrates that the object 12 has a thin layer 12A of plating. Further, FIG. 7(A) illustrates that the invention preferably further includes a screen 131 located near the face of the object 12 to be plated and connected to cable 24. The screen in useful in electroplating and is particularly useful in the immersion process of plating an object 12.

Figure 7B:
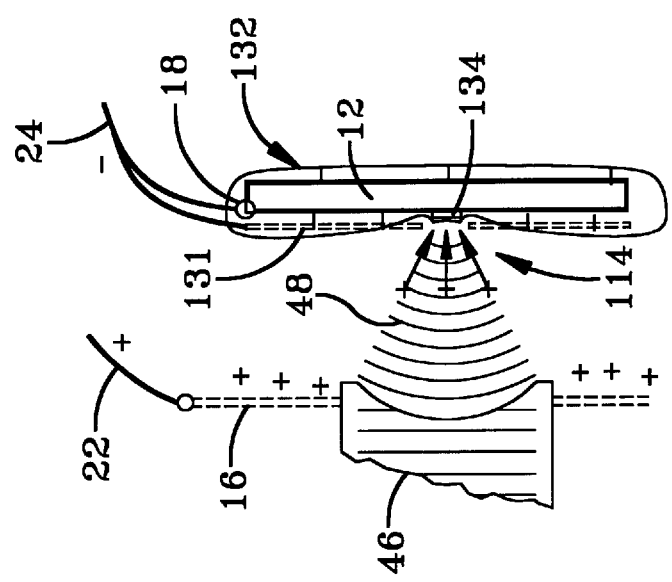

FIG. 7(B) shows the application of the acoustic beam 48 to create a zone 114 of increased plating rate. The portion of the surface outside the beam is shielded by the depleted layer 132 and thus plates very slowly. Most of the metal ions are flowing toward the surface of the object 12, identified by reference number 134, at the focus of beam 48. The beam 48 causes acoustic streaming and thus the object 12 surface 134 exposed to the beam will receive a flow of fresh plating solution undepleted of ions as the streaming penetrates the depleted layer 132. The surface of the object 12 in the focal zone also benefits from the effects of acoustic heating.

Figure 7C:
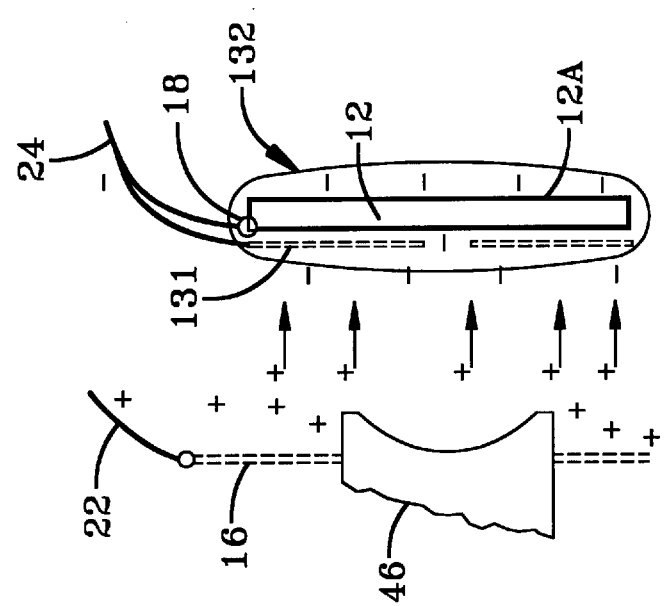

FIG. 7(C) shows the acoustic transducer 46 inactive and the polarity of the anode/cathode, shown on cables 22 and 24, respectively, is reversed, wherein the reversal may be accomplished by activating the polarity reversal switch 20A. It should be noted that the depleted layer is dispersed by natural diffusion or by agitation (with plating power and acoustic power off) before voltage reversal occurs. The metal ions are being extracted from the surfaces of the object 12.

The screen 131 serves as a stabilization screen and is used to enhance the process shown in FIGS. 7(A), 7(B), and 7(C). Some objects 12 like circuit boards are only partially covered with conductive material. These surfaces absorb the initial ions forming the depleted layer 132. Without the benefits of the stabilizing screen 131, the surface is only sparsely covered by conductive material (such as in circuit boards) and a very irregular and easily dispersed layer will form.

To create a thicker layer that also resists disruption, the stabilizing screen 131, preferably formed of a metallic material, is used and effectively makes the surface electric fields appear more uniform to the plating process. This screen 131 is connected so that it has the same voltage polarity as the object 12 being plated. The tendency to see high plating around sharp or thin features is inhibited by the screen 131.

The screen 131 may be held in contact with the object 12 or very close so as to help trap the depleted layer 132 at the surface and inhibit disruption from stray liquid convection currents. The screen 131 may be made of very thin wire so as to be acoustically transparent to the acoustic beam 48 and provide minimum resistance to the streaming process. Holes may be cut in the screen 131 to provide unobscured access to the acoustic beam 48 in the intended plating areas.

When voltage reversal is applied, the screen 131 and the object 12 both release plating ions. The plating on the surface exposed to the beam 48 becomes thicker after repeated cycles, while-the screen 131 and the surface away from the beam 48 remains very thinly plated.

The screen 131 also helps control the flow of the plating solution as the stream encounters the surface and then flows along the surface. The screen 131 outside the intended plating area further depletes any remaining ions and further insures full depletion of the solution.

A further embodiment, previously mentioned as acoustic fountain plating, may be further described with reference to FIG. 8, which is composed of FIGS. 8(A), 8(B), and 8(C).

Figure 8A:
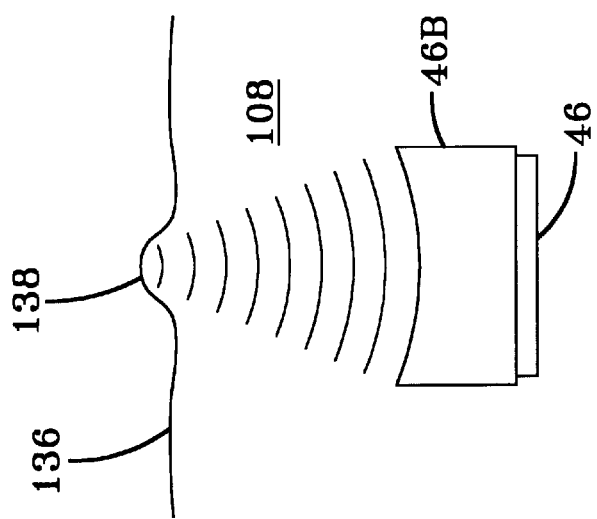
FIGS. 8(A), 8(B) and 8(C) illustrate the features involved with the acoustic fountain plating embodiment of the present invention.

FIG. 8(A) illustrates an acoustic transducer 46 producing an acoustic beam 48 that is aimed at the surface of a pool of plating solution 108. The bump 138 on the free surface 136 represents a low level fountain. The fountain 138 is sustained primarily by acoustic radiation pressure. Acoustic streaming will also be present and assist the fountain formation. Acoustic streaming alone is usually not sufficient to create a sizeable fountain. The practice of the present invention has shown that fountains 138 may be formed even when acoustic streaming is blocked by solid film barriers.

Figure 8B:
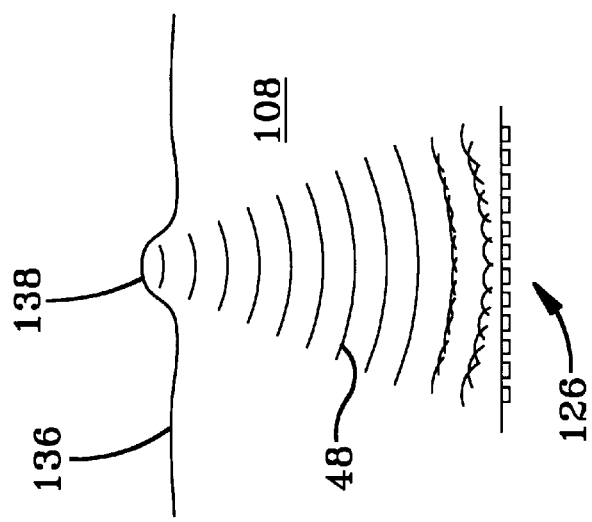

FIG. 8(B) illustrates that an acoustic fountain 138 may also be formed by acoustic phased array 126. Generally acoustic phased array 126 is not as accurate as physically focused lenses, such as lens 46B. However, the ability to steer the beam and adjust the focus on the fly is an advantage that makes using phased array 126 appealing to the user.

Figure 8C:
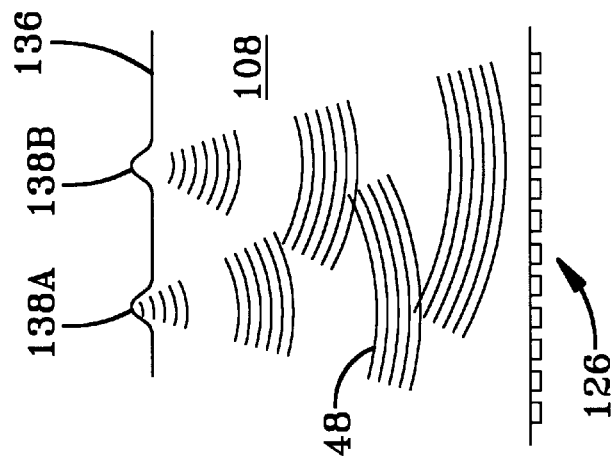

FIG. 8(C) shows the effect of beam hopping and illustrates the potential to create multiple fountains 138A and 138B and rearrange them on command. This ability allows the user to program the system to accommodate the plating patterns of each part. Further, this ability allows the system 10 to track moving parts such as objects 12 transported on a previously mentioned conveyor system. Further details related to the acoustic fountain embodiment of the present invention may be further described with reference to FIG. 9 which is composed of FIGS. 9(A), 9(B), 9(C), and 9(D).

Figure 9A:
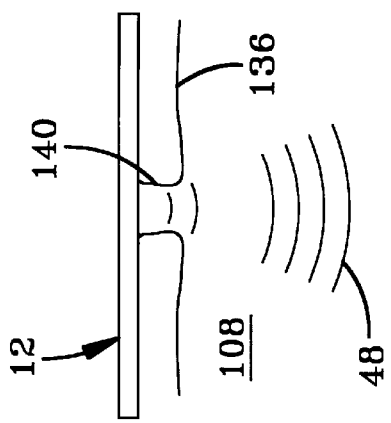
FIGS. 9(A), 9(B), and 9(C), and 9(D) illustrate further features involved with the acoustic fountain plating embodiment of the present invention.

FIG. 9(A) shows the initial contact by fountain 138 and the object 12. The fountain 138 may be completely turned off until ready. Acoustic power may be turned "on" and "off" so a fountain 138 may rise or collapse within a few milliseconds of a command to do so. The acoustic beam 48 is directed onto a free surface of the plating solution 108.

Figure 9B:
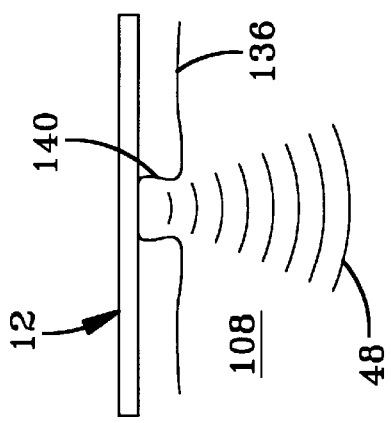

FIG. 9(B) shows the wetting and spreading 140 of the liquid plating solution 108. Depending on the surface tension properties of the surface of the object 12 and those of the liquid 108, the initial contact point may spread rapidly. The height of the object 12 above the pool 108 plays a role in the size of the plated area. Gravity will create a "head pressure" that counteracts acoustic and surface tension forces and will tend to pull the liquid back toward the pool.

Figure 9C:
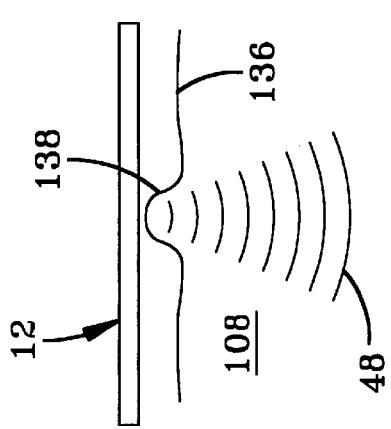

FIG. 9(C) shows the use of tone bursts 48 to control the acoustic contribution of the wetting process 140. Since acoustic power is quickly and easily controlled, it is the primary control means for this embodiment. A secondary means of controlling the wetted surface 140 is to control the height of the object 12 above the pool 108. Another means of controlling wetted area is to use thin films of non-wetting material, such as an inexpensive water repellant. This thin film reduces surface tension and inhibits spreading. This thin film may be applied as a spray on or brushed on mask that is applied prior to the plating process.

Figure 9D:
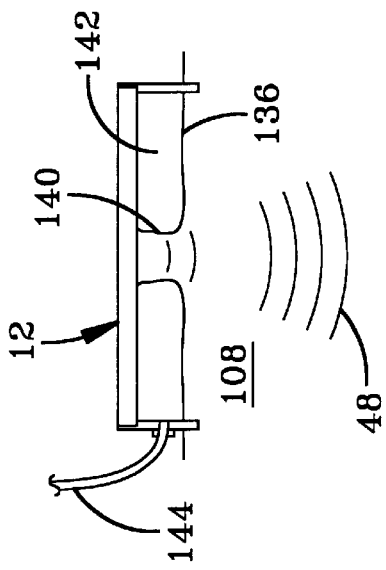

FIG. 9(D) shows yet another means of controlling wetting 140 by creating a airtight skirt 142 or gasket trapping gas around the edge of the object. 12 or plated area thereof. The skirt 142 traps gas between the object 12 and the pool surface 136. As the fountain and wetted area spreads, a hydrostatic pressure will rise due to the displacement and compression of the gas by the liquid. At the point of equilibrium, the force of surface tension and acoustic radiation pressure and streaming match the gravity as well as the hydrostatic pressure being matched, causing the liquid plating area to stabilized. This method may be further improved by attaching a regulated pressure supply 144 to the volume that can increase or decrease the pressure and thus provides an additional means of controlling the wetted area associated with the object 12.

Modes of Operation

The practice of the present invention increases the control of material deposition in plating and the electroplating processes by employing the effects of high intensity acoustic waves directed at an area on the surface of an object being plated. The beam of high intensity waves causes acoustic streaming and localized acoustic heating. As previously mentioned, acoustic streaming is used to create a liquid current that provides fresh plating to the surface of an object 12 in the acoustic beam's path. The user may take advantage of the liquid stream to deliver fresh electrolyte to the target surface. Further, the user may also take advantage of the increased chemical reaction rate due to acoustic heating of the electrolyte.

In the prior art, the liquid plating solution near the target surface will quickly become depleted of the plating metal ions. The prior art uses agitation of the plating bath to assist in providing fresh undepleted solution to the target surface. In contrast, in the practice of this invention, the process is kept quiescent to inhibit overall plating rate. Meanwhile, the localized plating is accelerated by acoustic streaming to drive fresh undepleted liquid into the intended plating zone. The plating tank 14 is maintained in a quiescent or non-agitated state except for the region where the acoustic energy is being applied. When the electric field is applied, regions near the surface of the object 12 will deposit the metal ions, but quickly become depleted. The plating rate in these depleted areas will slow and become inefficient. In effect the depleted layer becomes a mask. To further inhibit overall plating, the plating tank 14 can be chilled or maintained at a temperature that is lower than conventional plating using bath temperature conditioning means 146 shown in phantom in FIG. 1.

An acoustic transducer, such as transducer 46 creates an acoustic beam 48, which may be focused at a selected zone 114 on the target surface. By using a focusing device, such as lens 46B, the volume of high intensity can be restricted to a target zone 114 and minimize the disturbance of the rest of the liquid 108.

The localized zone of acoustic streaming causes fresh undepleted plating liquid 108 to flow toward the target surface area displacing the depleted plating liquid. In effect, the acoustic streaming penetrates the mask of depleted liquid. Acoustic heating increases the temperature of the plating solution 108 in the zone 114 and also increases the temperature of area on the surface. The combined effect of increased liquid and surface temperature creates a zone with higher chemical activity and higher diffusion rates. Therefore, the acoustic beam is creating a contrast in concentration and temperature between the target area and the overall surface.

The rate of liquid delivered by streaming should be matched to the plating electric field. For a given volume flow to the corresponding electrical current should be low enough to prevent the occurrence of an irregular or grainy deposition. Such deposits are indicative of a voltage that exceeds the ability of the electrolytes to deliver the ions in a uniform layer. Yet, the electrical current should be high enough to deposit and effectively deplete all the electrolyte liquid delivered by streaming, otherwise, the benefit of acoustic streaming is diminished.

Once the stream encounters the surface it diverges and flows along the surface beyond the intended target area. At the point the streaming liquid reaches the edge of the desired plating area the liquid should be effectively depleted. Therefore, careful matching, taken into account in the present invention, of electrical and acoustic parameters is important to maskless operation. Because there are many variables that effect the plating solution and the constant change in ion concentration during the plating process, matching the electric field to the streaming rate is best done experimentally.

The increased temperature of liquid and object within the desired plating area locally increases chemical activity and, in turn, increases the deposition rate. The liquid volume flowing away from the acoustic beam cools and eventually reaches a steady state with the lower temperature liquid 108 outside the zone 114 formed by the beam 48. Consequently, the liquid 108 flowing away also becomes less chemically active.

The plating in the zone 114 caused by the beam 48 will be much higher than the areas away from the acoustic beam 48. A transition zone at the edge of the beam 48 is evident by a transitional deposit thickness. A sharper transition occurs if the liquid flow is moderate and the electric field within the zone 114 is matched.

The electroplating process that employs acoustic waves may be further improved by combining the acoustic effects with periodic reversal of the plating voltage. The technique is also known as "pulse plating" in the prior art. The objective is to periodically reverse the voltage of the plating process so that the metal previously deposited is extracted. The practice of the prior art uses voltage reversal to counteract the edge effects and high deposition around sharp features.

The combined plating technique will deposit a relatively heavy layer in the zone 114 where the acoustic beam 48 was applied, but a thin layer will deposit outside the zone 114. This is due to the plating that occurs until the depleted layer is formed as described with reference to FIG. 7. To remove the excess plating the acoustic beam 48 is turned off and the contents, liquid 108, of tank 14 is allowed to come to equilibrium. Conventional agitation may be applied in this period. The reverse voltage is applied and the plating is removed at a uniform rate. Since the plated zone 114 is a few times thicker but may not have sharp features, it will be reduced by a similar amount as the rest of the surface. The end product, that is, object 12 will have a plated area that is somewhat thinner, but the rest of the surface of object 12 will be nearly free of plating. This approach can be repeated with the plated area in the acoustic beam becoming successively thicker while the surface away from the beam 48 is still nearly zero.

The practice of the present invention includes immersed electroless plating with directed high intensity acoustic beams. The operation for electroless plating is similar to electroplating, except there is no modulation by externally applied electric fields created by the anode and cathode. Thus, there are no reverse or pulse plating modes. The benefits, relative to prior art, are those gained through the acoustic streaming and acoustic heating and the methods used to modulate beam power and shape.

The practice of the present invention further includes acoustic fountain plating. This technique combines acoustic streaming and acoustic heating effects, described hereinbefore, with acoustic radiation pressure. Acoustic radiation pressure may be used to manipulate a free surface of a pool to form surface bulges or fountains 138. The fountain 138 will be further influenced by acoustic streaming which will produce a flow of liquid into the fountain 138 and further increase its height.

By using an acoustic beam 48 to create a fountain 138, the liquid 108 can be forced to make contact with a object 12 suspended above the pool 108. By manipulating the acoustic power, the shape and position of the beam 48, the contact area of object 12 can be controlled. By controlling the contact area, the surface exposed to plating solution 108, as well as the size and shape of the plated area is controlled. In this way, the practice of the present invention provides a maskless means of selectively plating a surface by controlling the behavior of the plating liquid 108. In some instances, the liquid 108 wets a surface and tends to spread over the surface due to surface tension. By providing sufficient distance between the surface of the objects 12 and the pool surface 136 gravity may be used to help limit spreading. The acoustic power selected for the beam 48 may be used to bridge the distance between the pool and the object 12 and may be modulated to further control the plating process. An initial contact may be made at high power and then reduced until surface tension force, gravity hydrodynamic and acoustic forces come into equilibrium. This then provides a steady wetted area that may be increased, decreased or disconnected by use modulation of the acoustic beam 48.

The acoustic beam 48 may be modulated by amplitude, duty cycle or burst modulation all known in the art. Frequency modulation may be used to modulate acoustic streaming while maintaining a constant radiation pressure. In the performance of the plating processes of the present invention, tone burst mode is the primary mode of operation. Since the effects of acoustic streaming non-linear functions of intensity and frequency, short bursts at high intensity is preferred. Continuous wave operation may be used to create streaming. This approach is simple, but controlling the streaming rate is limited to amplitude modulation. Because acoustic streaming and heating are non-linear, they are not proportional to the wave amplitude. To provide a more linear or proportional control it is easier to maintain a high amplitude and simply adjust the average power by controlling the duty cycle of the acoustic beam. In other words adjusting the burst duration, burst repetition rate or both provides flexible control.

Beam Control Modes of Operation

In some instances involved with the practice of the present invention, it may not be necessary to focus the waves contained in beam 48. An unfocused beam 48 is the simplest to produce and may have a relatively long working distance. The transducer 46 needs to emit high intensity directly from the emitting face which implies high power density. To prevent overheating a cooling method may be needed, such as employing the chilling means 146 of FIG. 1. A small duty cycle will also greatly reduce the average power required for the plating process. In addition, the beam 48 will be subjected to the high non-linear attenuation effects of high intensity and will create streaming and heating effects well away from the target surface 114. Further, the beam 48 will diverge and decrease in intensity in the far field of the beam 48. Therefore, unfocused beams may be best applied over short distances or in arrays from many transducers 46 and 126.

As stated earlier, the use of high intensity tone bursts is the preferred mode for the electrical signal and corresponding acoustic waves. High intensity is needed to cause the desired non-linear effects of heating and streaming and burst mode provides a means to the control them. In burst mode, the liquid accelerates from stationary to steady streaming. This transient period of acceleration provides more time for liquid to heat up, particularly, in a focused beam. It has been observed that brief "puffs" of hot liquid form during this transient. Further, as the streaming achieves a steady state velocity the liquid motion disperses the heat energy. It is believed that the effects of streaming, and the "puff" of hot liquid electrolyte combine to locally increase the plating rate.

Burst mode operation might typically have a duty cycle of 10 percent. In other words, the acoustic waves are being emitted for 1,000 microsecond burst for every 10,000 microsecond period. Longer periods with corresponding longer bursts will tend to form the hot liquid "puff" effect previously mentioned. Short bursts, such as 10 microsecond for every 100 microsecond period, will maintain the 10% duty cycle but create a more uniform streaming effect with little apparent temperature increase. Yet both long and short periods of the same duty cycle will have the same average power.

A focused beam is preferred over unfocused. Focusing delivers the high intensity waves to a small focal zone and thus the non-linear effects are confined to a small region. The waves of a focused beam start out at low intensity and do not experience significant attenuation thus better preserving the power delivered to the focal zone. Focusing the beam also lets the user employ larger transducers that are less stressed by internal heating and thus can tolerate a greater duty cycle. Further, the acoustic heating effect occurs well away from the transducer which further reduces transducer heating. In contrast, an unfocused beam tends to distribute the energy over a larger volume thus making it more difficult to achieve the non-linear effects.

In other embodiments, focused beams 48 are employed that use various lens designs and are preferred for operations using simple object 12 with little variation therein. Electronically controlled phase focused beams 48 produced by phased arrays 126 are preferred for flexible programmable systems that may need to deal with a variety of surface shapes or need to employ the beam manipulation modes available from phased arrays.

As previously mentioned with reference to FIG. 9, it is important in the practice of acoustic fountain plating mode to use tone bursts 48 to control the acoustic contribution of making liquid contact and wetting of the object. The height of the fountain extending from the pool is primarily dependent on the acoustic radiation pressure and secondarily on acoustic streaming. Long periods between bursts will cause the fountain height to oscillate. Any oscillation is at risk of coupling with surface wave motions that may cause the process to become chaotic.

The smaller the fountain the more sensitive it is to period duration and duty cycle. Periods of less than a few milliseconds are acceptable to fountains that are a several millimeters across. For acoustic fountains of tens of microns in scale, the period is a few microseconds. For diffraction limited lenses the wavelength governs the size focal zone and thus the size of the fountain. The wavelength for a given frequency depends on the speed of sound in the liquid electrolyte that varies from liquid to liquid. A 1 MHz frequency in a typical liquid may result in a fountain on the order of a millimeter. Fountains that are about 10–50 microns require a corresponding frequency approximately 100 MHz.

With reference to all modes, in particular to the frequency used for the acoustic excitation, there is no exact or hard upper limit. More particularly, it simply becomes too difficult to produce high power transducers above 100 MHz. The 1 MHz lower limit is also not exactly fixed, but below that point (1 MHz) it is hard to get streaming without using excessive power which may begin to damage the target object 12.

The practice of the present invention also uses a beam hopping mode when it is desired to quickly move the focal point of the array 126 to multiple target surfaces or parts. The beam hopping is performed rapidly enough that the plating process appears to have multiple beams from a single array 126.

The invention may also utilize a sub-array multiple beam mode where the array 126 is divided into sub arrays that are independently controlled, such as those already described with reference to FIG. 6(C). This mode is simpler than beam hopping and may be more effective when the object 12 or surfaces are too close to the overall array 126 to permit effective beam hopping.

Another mode used is a scan mode where a subset of the elements, such as 126A already described with reference to FIG. 6(D), is active and focused at a surface. Subset adds elements at one end and drops elements at the other end sequentially which effectively scans along the array and the surface. This scan mode may be useful when either the array 126 or the surface of the object 12 is moving relative to the other as in a conveyor system. The scan mode may also serve as a way of plating a linear pattern using a small focal zone.

FIG. 6(E) illustrates a beam hopping mode that utilizes the phase array 126 to create multiple, such as three (3), of wave bursts 48 that respectively focus on three (3) target surfaces 114. As previously mentioned, the focal point of the array 126 is hopping so rapidly between target surfaces 114 that it appears multiple beams 48 are being produced.

A further mode used is a beam reflection mode employed when an object 12 has a surface that not in line-of-site of the transducer 46, but is accessible through a reflection off another object in a manner as already described with reference to FIG. 6(F). This may apply to simple focused and phased array devices.

A beam 48 through transmission mode, previously discussed with reference to FIG. 5(C), is preferably used when a surface, such as a buried cavity or deep hole, is accessed by transmitting the beam 48 through the solid to create the streaming effect inside the electrolyte filled cavity or hole. This may apply to simple focused transducer 46 and phased array devices 126. An array switching mode is used when a multiple set of arrays, such as those already described with reference to FIG. 6(C), are available and can be switched on and off using a common set of RF amplifiers 28. This allows multiple arrays 126 to be multiplexed by a single set of electronic controls and amplifier equipment, such as that shown in FIG. 1.

Liquid Modes of Operation

A so called "acoustic streaming into the surface modem" is the primary or preferred liquid mode of operation of the present invention due to the broadest range of application. The transducer 46 is positioned opposite of the object 12 or surface of object 12 to be plated and a beam 48 is formed that directly impinges upon the surface of object 12. Streaming propels liquid 108 into the surface which deposits plating as it diverges and flows in a radial pattern along the surface. In the center of the beam 48 a stagnation zone may form which has little or no velocity. The acoustic heating should be the highest in the center. Slightly away from the center of beam 48, the liquid 108 used for the plating process will have its highest velocity which will tend to distribute the acoustic heating through a larger volume of liquid 108. As the liquid 108 moves out radially, its velocity decreases while its concentration of ions decreases. The decreased velocity gives the liquid 108 more time to transfer ions to the surface and thus deplete the liquid 108 more thoroughly. Streaming away from the target surface outside the main beam 48 has been observed. The reversed streaming is believed to be due to reflected waves. The role of the reflected streaming is not well understood, but it is believed that it may further define the plating edge because a portion the plating liquid 108 flowing toward the surface makes contact and is then propelled away from the surface.

This complex interaction, is believed to be the mechanism that creates a relatively flat plated area with a distinct edge in accordance with the practice of the present invention. This appears to hold true for plating areas a few millimeters square, liquid velocities of a few millimeters per second, and electroplating voltages lower than 12 volts. At much higher streaming rates, the plated area is tapered over a wider area and the quality at the edges is inferior. The complexity of the acoustic waves, acoustic streaming, fluid dynamic, chemical reactions, and thermal interactions may actually be more complex than described.

Another liquid mode in the present invention is a so called "streaming from the surface" where acoustic waves pass through the object 12 so that object 12 emits on the opposite side of object 12. This will induce acoustic steaming away from the surface of the object 12. The liquid around the beam 48 at the surface flows into the beam 48 to replace the liquid propelled by streaming. As with the case of streaming into the surface of the object, the center of the beam 48 will have the lowest velocity at the surface of object 12, but the highest acoustic heating. The plating solution 108 flowing toward the center of the beam 48 is also being depleted as it moves inward. Due to boundary layer effects, the depleted liquid 108 along the surface of the object 12 around the beam 48 flows slowly. The liquid 108 replacing the liquid streaming is mostly undepleted liquid in the volume around the beam 48. The flow has a relatively low velocity and the tendency of acoustic beams 48 to accelerate liquid 108 along the beam 48 maintains laminar flow for a much longer distance than flows from a typical nozzle. This laminar flow may reduce turbulent mixing near the plating surface and encourage fresh liquid 108 to flow toward the surface of the object 12 being plated.

A further liquid mode in the present invention is a so called "hydrodynamic indirect streaming". In this liquid mode, acoustic streaming may set up a hydrodynamic current that acts away from the acoustic beam 48. An acoustic beam 48 creates streaming parallel to the surface and across an opening in the object 12 in a manner as previously described with reference to FIG. 5(E). This will cause a slight pressure drop due to the Bernoulli effect. This liquid mode could be employed to draw liquid through an opening or passage indirectly and accelerate the plating of passages. This is particularly useful for electroless plating of vias in circuit boards serving as an object 12. This liquid mode also creates the effect without using pumps and plumbing that is normally required in prior art processes. The indirect streaming also is a means of circumventing the so called "cutoff frequency or cutoff wavelength." More particularly, "cutoff" occurs when a hole being plated is smaller than the acoustic wavelength of beam 48 and therefore, inhibit the acoustic waves passing through the hole. It should be noted that this cutoff condition tends to stop most, but not all waves. By using streaming to create a hydrodynamic effect, much smaller holes may be plated.

A still further liquid mode is a so called "stream sweep". In this mode acoustic streaming acts along a surface where the acoustic beam 48 and the streaming liquid travel parallel to the surface. This provides a gradient where the liquid is depleted of ions as it moves along the surface. The acoustic beam tends to accelerate the liquid over distance and thus, the stream will tend to remain in the beam rather than diverging, as one would expect from a nozzle. The radiation pressure from the beam would also tend to displace obstructions such as bubbles on the surface of the object being plated.

Acoustic Imaging and Sensing Modes

Acoustic position sensing mode may be in the form of "echo location" and can be accomplished by a fixed device, such as transducer 46, or by a phased array 126. The transducer 46 may be operated as a sensor using a time of flight approach. More particularly, the transducer 46 may be driven by single pulses. The pulse emitted reflects from the surface of the object 12 being plated and is received by the emitting transducer or a nearby unit. The received signal must be supported by appropriate electronic controls such as a pulser/receiver 54 that can emit and receive the electronic signals from the transducer and retransmit the signals to another device or means for measuring the timing between the emitted and reflected pulse, such as signals 92 and 94, respectively, already described with reference to FIG. 2. The user can calculate the distance based on known acoustic velocities and the time of initial wave emission and wave reflection. By scanning this device, it is possible to create an image of the target surface of object 12 in a manner known in the art. This mode may be used for immersion plating and fountain plating processes.

Imaging may be accomplished by a single transducer 46 or by a phased array 126. The array 126 that forms the beam 48 for plating may be tuned to perform imaging as well. Alternatively, a parallel array 126 that is optimized for imaging may be used to image and help guide the acoustic beam 48 used for the plating process.

Position sensing may be used to locate a buried cavity or deep hole of the object 12 being plated and again guide the acoustic beam in the plating process. Simple reflection or echo location may be used to determine the depth of the cavity. By scanning either the object 12 or the transducer, the lateral position of the cavity may also be determined based on reflected signal timing and the strength of the reflection.

Acoustic material sensing mode may be used to sense differences in surface and subsurface acoustic properties of the object 12 being plated. Different materials have different acoustic properties and will transmit and reflect in different proportions. Therefore, a change from one material of object 12 to another can be determined based on the strength of the reflection. This would allow the user to determine where transition from metal to plastic or ceramic occurs. An example of material sensing application would be to use it to discriminate between metallic and non-metallic surfaces in electroplating. This could be used to keep a beam 48 focused on the metal surface of a circuit board and prevent wasting the beam 48 on non-metallic surfaces. It may also be used by a process control system to trace an edge of the object 12 as a guide for plating or detect the edge of an object 12 to turn the beam 48 on or off.

Electroplating Modes

For the electroplating modes, controlling the voltage is the most common method of controlling the electroplating process. A fixed voltage does not necessarily mean that amperage is fixed. Changes in bath 14 conductivity, the position of electrodes and surface area of objects 12 may vary. Therefore, the voltage should be regulated based on amperage measurements and more specifically amperage density. Each set of conditions will have an optimum amperage density so voltage control will be needed to assure the amperage is matched to a known surface area of the object 12 being plated.

In conventional electroplating the voltage and surface area of the object 12 is determined prior to the plating process because the plating bath 14 concentration is assumed to be constant during the process. The practice of the present invention controls the effective plating area by controlling the size of the acoustic beam 48. It also controls the liquid 108 delivery rate and thus, concentration of the liquid 108 in contact with the surface of the object 12 may be varied over time. As the beam 48 size and acoustic streaming rates vary, the voltage should be actively modulated. A computer or similar controller, such as the plating system control computer 68, may be used to coordinate the acoustic power in beam 48 and the electroplating power delivered from the power supply 20.

In the reversed voltage mode, the plating process may be enhanced by reversing the voltage potentials of the power supply 20, by use of the polarity reversal switch 20A, after acoustic streaming and heating has been used to increase the localized plating deposition. The voltage reversal applies to the entire exposed surface of the object 12. The voltage reversal may be performed while the acoustic beam 48 used to accelerate plating is not active. This allows metal to be removed from all areas of the object 12. The voltage reversal will remove plating material, particularly areas where high electric fields cause higher than average depositions. More particularly, the thinly plated areas outside the confines of the acoustic beam 48 that deposited during the depleted layer formation may be stripped completely while the thicker plating deposited in the confines of the acoustic beam 48 is reduced only slightly overall. For example, the thickness may be 10 microns overall with 50 microns plated where the acoustic beam 48 enhanced the process. The reverse voltage may remove 10 microns leaving 0 microns overall and leaving 40 microns on the surface enhanced by the acoustic beam 48. Every cycle to apply the plating increases the relative thickness of the plating in the confines beam 48 compared to the plating located away from the beam 48. These relative thickness should be taken into account during the reversed voltage mode.

Just as the acoustic beam 48 accelerates plating, it may also be used to accelerate the extraction process. Therefore, additional beams 48 may be employed to accelerate extraction in predetermined areas of the object 12. Acoustic beams 48 to enhance plating during forward voltage stage of the process and enhance extraction during the reverse voltage stage of the process make it possible to advantageously perform maskless selective plating.

Methods/Steps of the Invention

For the electroplating process, the first step is normally to mount and position the object 12 to be plated and connect the object 12 to the cathode connection 18 of the circuit, such as that shown in FIG. 1. Next position the acoustic transducer 46 and object 12 such that the beam 48 is at the appropriate distance from surface of the object 12. For a focused transducer 46 the object 12 should be located at the known focal zone 114. For an unfocused transducer, the object 12 should be located at or just beyond the near-field boundary of the acoustic beam 48 where the acoustic waves are more uniform. For phased array transducers 126 with their variable focal length, the relative position of the object 12 is determined by performance of the particular mode being used such as beam hopping and beam scanning modes.

Next the RF signal parameters are set for the plating application. The normal mode is to operate the system with a set frequency and set amplitude both selectable from the RF signal generator 26. Most power modulation is performed by modulating the burst duration and the repetition rate of the RF signal developed from the RF signal generator 26. For phased array 126 operation the phase shift parameters for beam focusing need to be determined and entered into the control computer 68 via the user interface 66.

The power is then applied to the plating bath 14 by activating the plating power supply 20. This will deposit a layer of metal, which will deplete the liquid 108 around the object 12. The current will drop as the depleted layer 132 forms, thus slowing the process. Once the depleted layer 132 is formed, the transducer 46 is activated and the acoustic beam 48 impinges on the target surface area on the object 12. Acoustic streaming begins to flow fresh electrolyte and an accelerated plating rate occurs in the area of the beam 48. The accelerated plating process continues for a predetermined time based on experience or on a calculated thickness. The plating current and acoustic power of beam 48 is then turned off.

For the electroplating with voltage reversals, the voltage polarities on the anode 16 and cathode 18 electrodes are reversed and the plating is extracted from the surface of the object 12. It may be necessary to let the bath 14, more particularly the liquid 108, rest so that the depleted layer 132 dissipates or a brief agitation may be used to mix the depletion layer 132 with the rest of the liquid 108. The agitation may be done acoustically. The reverse process will remove the plating from all locations of the plated object 12 including areas in the acoustic beam 48. Because the surface areas in the beam 48 may be much thicker, the de-plating operation will only remove a portion of the plating even after plating has been removed from the rest of the surface. The process may then be repeated where a depleted layer 132 is established, acoustic beam 48 being applied and then reversed. The process may be repeated as needed.

For the electroless or autocatalytic plating process, an initial set-up of the acoustic devices, such as transducer 46, is desired. The plating reaction occurs automatically on contact and cannot be controlled by external electric fields, such as those produced from the plating power supply 20. Therefore, plating starts when the object 12 is initially immersed in the plating bath. Once a layer 132 of depleted material is formed around the object 12, the acoustic beam 48 is applied to the targeted areas.

The acoustic fountain process may comprise either electroplating or electroless plating. The position of the transducers 46 needs to be adjusted to assure that the pool surface 136, previously described with reference to FIG. 9, is near or within the focal zone 114 of the beam 48. This is needed to assure that the beam 48 can achieve sufficient intensity to create a fountain 138 high enough to reach the object 12. The object 12 is suspended above the pool surface 136 with enough distance to prevent inadvertent wetting by surface waves or slosh, yet close enough to be easily reached by the fountain 138. A distance of a few millimeters is sufficient for most applications.

Acoustic power may be turned "on" and "off" so a fountain 138 may rise or collapse within a few milliseconds of a command. FIG. 9 illustrates the steps of the process as it progresses from initial contact through wetting phase and then into a modulated control of the wetted area by acoustic modulation. For maskless operation, the acoustic forces, surface tension, and gravity all must be in balance within the region where the plating is occurring in order to maintain control of the plating.

The steps of the acoustic fountain plating include placing the object 12 in a position above the pool surface 136 within reach of the fountain 138. If the object 12 is on a continuous moving conveyor, then the position of the object 12 and operation of the fountain 138 must be synchronized. The dwell time of the object 12 in the fountain 138 needs to also be predetermined.

Once in position, the acoustic power is applied to raise the fountain 138. If long bursts or continuous wave operation is used, then a standing wave condition may set up. In this situation, the distance will likely "snap" to heights that appear in half wave increments of the standing wave. Other positions are unstable because multiple reflected waves will tend to cancel each other except for the standing wave patterns. Any motion of the surface will create surface waves that may couple with the fountain 138 formation causing erratic behavior. Therefore, damping at the edges of the tank 14 may be needed to prevent a chaotic system from arising with the tank 14. Overall, the use of bursts of acoustic waves 48 that are too short to create a resonating standing wave condition and the careful control of burst rate to prevent coupling with surface wave modes provide an acceptable means of control.

As the fountain 138 makes contact with the object 12, the surface tension properties of the surface of the object 12 and the liquid 108 become important. If strong wetting properties are present, the initial contact area of the object 12 will spread rapidly and in some cases overtake the entire surface. In a masked process, the mask prevents plating in non-selected areas of the object 12. If the entire surface floods with liquid 108, then the process behaves more like an immersion process. However, carefully applied wetting barriers at the edges of the selected plating area halt the excessive spread. The edges may be treated by a thin layer of water repellant applied in a thin line around the perimeter of the selected area. This technique negates the need for a full coverage mask.

If the materials are non-wetting, then the liquid 108 will not tend to spread and the force of the acoustic beam will entirely control the plating size. Without the assist of surface tension the dominant opposing force is gravity which will tend to pull the liquid 108 back toward the pool surface 136.

A hydrostatic method to control spreading is also possible. For this method, wetting is controlled by an airtight skirt or gasket around the edge of the object or plated area in a manner as already described with reference to FIG. 9(D). The skirt 142 traps gas between the object 12 and the pool surface 136 creating a fixed volume. The intrusion of the fountain and spreading of liquid increases the hydrostatic pressure in the trapped volume. At the point of equilibrium, the force of surface tension and acoustic forces match and the gravity, and hydrostatic pressure liquid plating area is stabilized. To assist the process forcing gas into the space and increasing the pressure from an external source may also serve to modulate the size of the plated area by modulating the hydrostatic pressure at the liquid plating area.

In the electroplating embodiment of acoustic fountain plating, the electric plating power is applied once the plating wetted area is stabilized. The plating thickness may be controlled by the time duration of the process. If multiple fountains 138 are used, each fountain 138 may have independently controlled exposure times and acoustic intensities. Thus, plating thickness applied by each fountain may be different which allows the user to plate multiple areas of an object 12 with different thickness in a single operation.

After plating is complete, the acoustic fountain plating is terminated and the liquids drops back into the pool except for a minute residual volume. In electroless plating, the fountain 138 contact may be a means of starting and ending the plating deposition. Therefore, the acoustic fountain 138 contact may serve as the primary method of controlling thickness for the electroless plating process. The acoustic fountain plating is an embodiment where the target object 12 or surface thereof to be plated is not immersed in the liquid. In this embodiment the liquid 108 is contained in a pool which may be much shallower than an immersion plating bath 14. A transducer 46 is mounted below the surface and its acoustic beam 48 is focused at the surface in a manner as previously described in reference to FIG. 8(A). The high intensity acoustic beam 48 causes acoustic radiation pressure to act on the liquid 108 to cause a surface distortion or bump 138. The bump 138 is sustained by radiation pressure. The liquid 108 is streamed into and out of the focal zone 114 driven by the incident waves and the reflected waves. An object 12 is suspended a short distance above the pool. When the acoustic beam 48 is applied, the liquid contacts and wets the surface. Conversely, when the beam 48 is not applied the liquid 108 breaks contact with the object 12. The fountain or bump 138 is switched on and off so that contact is controlled through acoustic beam application.

In electroless plating contact by the use of the acoustic fountain 138 is enough to produce plating. In electroplating, the plating voltage produced by the plating power supply 20 is required and only the conductive surfaces are plated. Similar to the immersion process, in electroless plating acoustic streaming delivers fresh electrolyte to the wetted area. Acoustic heating will also enhance the plating in the wetted area exposed to the beam.

The wetted and non-wetted area defines which area receives plating. The use of radiation pressure in conjunction with acoustic streaming and heating provides an added degree of control freedom. The area wetted, such as area 140 of FIG. 9(B), may be slightly different from the beam area. Further, the wetted area may spread due to capillary forces. To help control the size of the wetted area a simple non-wetting barrier coating may be applied. A simple water repellant may be applied than can be used to define the wetted boundary. Unlike a masks where large areas are protected only the edges of the wetted area need to be coated.

The acoustic fountain process requires continuous waves to maintain a constant fountain. However, an alternative is to use burst control to create a pulsating fountain. The pulsating fountain rapidly applies liquid solution 108 then recedes after each burst. This reduces the effect of time dependent wetting due to capillary forces.

It should now be appreciated that the use of directed high intensity acoustic beams provides an advantage with regard to the level of control of the plating process. The invention provides the user with new ability to manipulate the plating process and do things that are not possible with conventional techniques alone. More particularly, high intensity acoustics waves modify the behavior of liquids in terms of chemistry, thermodynamics and hydrodynamics. The beams 48 may be switched on and off instantly. The beams 48 may operate through intervening barriers so they may act on the process without intruding into the working volume. The acoustic beams 48 may be produced by simple fixed focused transducers 46 or by complex phased arrays 126 capable of beam steering and dynamic focusing. The flexibility of phased arrays 126 also permits multiple functions and applications to be performed including processing of multiple plating surfaces simultaneously. Further, the acoustic transducers are capable of sensing reflected acoustic waves. The reflected signal may be observed and measured by an oscilloscope or similar instrument. Measurements of time delay and changes in signal strength and phase characteristics may be used to determine the position and orientation of an object 12 being plated. The practice of the present invention accelerates the plating process in the surface area affected by the beam 48. Acoustic streaming can manipulate the fluid dynamics of liquid delivery. Acoustic heating can increase the chemical reaction rate. Acoustic radiation pressure can propel objects including bubbles. Acoustic radiation pressure in combination with acoustic streaming can manipulate free liquid surfaces.

It should be further appreciated that the present invention by the use of acoustic sensing allows for variations of the acoustic plating processes including immersion and acoustic fountain types that may take advantage of the ability to acoustically sense and even image the target object or surface thereof. Acoustically sensing the longitudinal distance and the lateral position may serve as feedback for a process control system. The position sensing may provide position information for initial alignment of objects 12 and transducers 46 and 126. This sensing ability may further help locate buried cavities and passages of the object 12 being plated that are not otherwise visible.

Acoustic sensing may further be used to sense differences in surface and subsurface consistencies of the object 12 being plated. Different materials will transmit and reflect in different ratios. Therefore, a change from one material to another can be determined based on the strength of the reflected signal. This would allow the user to determine where transition from metal to plastic or ceramic occurs. This information may be used to keep a beam 48 focused on the metal surface of a circuit board and prevent wasting the beam 48 on non-metallic surfaces. It may also be used by a process control system to trace an edge as a guide for plating or detect the edge of a part to turn the beam on or off.

Still further, it should be appreciated that the invention increases the control of material deposition in immersion electroplating processes by employing the effects of high intensity acoustic waves directed at the surface of an object 12 being plated. The beam 48 of high intensity waves causes acoustic streaming and localized acoustic heating.

The advantage of the acoustic streaming is the ability to deliver fresh electrolyte to the target surface. The size of the beam 48 can be controlled by beam focusing and steering methods. The liquid velocity and volume flow rate within the beam may be controlled through control of acoustic power and frequency.

The advantage of acoustic heating is the ability to increase the chemical reaction rate. The beam 48 will cause the liquid and the surface of the object 12 to be heated in a localized area. The acoustic heating, thus, provides an ability to accelerate the electro-deposition rate in the affected area.

The ability to use directed acoustic beam to accelerate the plating process provides a method of selective plating that eliminates or reduces the need for masks used in the prior art. Elimination or reduction of masks provides cost benefits. The cost of mask materials such as tapes and photoresists and related specialized tools are reduced or eliminated. The cost of handling, processing and disposal of toxic mask compounds and processing liquids is reduced or eliminated.

Moreover, it should be appreciated that the practice of the present invention provides the advantages of coupling directed high intensity acoustic beams with pulse electroplating which reduces the need for masking. However, the coordinated use of acoustic effects in conjunction with the effects of electroplating voltage reversal provides mutual benefits. The voltage reversal removes the plating that was applied outside the beam. It also removes a similar amount from the beam area, but because it has a thicker deposition some plating remains. The combination of effects provides an improved method over plating with an acoustic beam alone.

The original intent of pulse plating is to reduce the occurrence of thick deposits due to electric field edge effects. If combined with acoustic streaming, during the reversed phase, these deposits may be removed more quickly. The overall advantage is the ability to create a near perfect localized plated area on an unmasked surface.

In addition, it should be appreciated that the practice of the present invention provides advantages for electroless plating similar to those of electroplating. The process may be locally accelerated due to acoustic streaming and acoustic heating. Without external electric field control the process cannot be easily reversed or switched on and off on command. The use of directed high intensity acoustic beams, however, also assists in plating areas that are not easily refreshed by plating solution with normal agitation. The electroless plating through holes or vias in circuit board manufacturing is an example.

It should be further appreciated, that the practice of the present invention provides a technique, which combines the acoustic streaming and acoustic heating effects, described before, with acoustic radiation pressure. Acoustic radiation pressure and streaming may be used to manipulate a free surface of a pool to form surface bulges or fountains 138. By using an acoustic beam to create on command a fountain 138 the liquid 108 can be forced to make contact with an object 12 suspended above the pool. An advantage of this approach is that the size and shape of the plated area is controlled by manipulating the shape and position of the fountain 138. In this way, the invention provides a maskless means of selectively plating a surface by controlling the behavior of the liquid by acoustics rather than relying on masking. The process appears similar to both "brush plating" and "jet plating", but this process can be more precisely controlled and repeatable from part to part.

Another advantage is this technique may be applied to both electroplating and electroless plating.

Another advantage is the acoustic streaming and heating effects will act to accelerate the plating process over a simple fountain that is driven by hydrostatic pressure.

Another advantage is that contact with the surface may be made and broken on command. This is useful when timing of processes is important such as in production applications.

Another advantage is the ability to work with surface tension and with gravity to control plating area shape and size. The acoustic beam may be used to adjust for changes and variations in the wetted area.

Another advantage is that acoustic streaming and acoustic radiation pressure may be altered independently. By taking advantage of the fact that acoustic streaming and heating varies with frequency as well as with intensity, the rate of streaming and heating may be changed while radiation pressure is held constant. Therefore, a fountain 138 may be formed to make contact with the object, but the streaming and heating may be varied.

Although there has been shown and described multiple preferred embodiments of the present invention, it should be understood that the present invention is still capable of changes and modifications that are within the scope of this invention.

What we claim is:

1. A system used for plating objects comprising:
   a) a container holding a plating solution in which is lodged anode and cathode electrodes connected to respective electroplating voltages and with the cathode electrode connected to the object to be plated, said container having means for holding an object at least near said plating solution;
   b) a source of radio frequency (RF) having an output; and
   c) a transducer receiving said output of said RF frequency source and developing an output beam of acoustic waves directed at least near said object.

2. The system according to claim 1, wherein said directed beam covers a portion of said object and creates a plating level of thickness that is greater than that of the portion of said object not covered by said directed beam.

3. The system according to claim 1, wherein said source of high frequency has selectable power output levels, and a power output level is selected thereof so that said beam directed onto said object removes bubbles and debris from said object, while at the same time creates a plating on said object.

4. The system according to claim 1, wherein said electroplating voltages have means so as to be first activated causing depleting of said plating solution around a portion of said object and then said directed beam has means so as to cover said portion of said object depleted of said solution.

5. The system according to claim 4, wherein said system further comprises means to provide agitation of said plating solution around said portion of said object after plating voltage is turned off and before reverse voltage is applied.

6. The system according to claim 1, wherein said source of high frequency has selectable power output levels, and a power output level is selected so that said beam directed onto said object prevents concentration of gas contained in said plating solution from giving rise to bubbles therein, while at the same time creates a plating on said object.

7. The system according to claim 1, wherein a portion of said object is held so as to be suspended over said plating solution and said beam is directed onto a free surface of said plating solution at a region near said suspended portion of said object, so as to create a fountain of said plating solution which makes contact with an area of said object.

8. The system according to claim 7, wherein the size and shape of said contact area of said object is determined by the acoustic power and shape of said acoustic beam and the distance said acoustic beam from said region of said plating solution.

9. The system according to claim 7, wherein a portion of said object is coated with a non-wetting material.

10. The system according to claim 9, wherein said non-wetting material comprises thin film of water repellant material.

11. The system according to claim 8, further comprising a gasket placed around an edge of said object and arranged to trap gas between said object and said plating solution and to create a hydrostatic pressure between said object and said plating solution.

12. The system according to claim 1, wherein said object is held so as to be immersed in said plating solution and said beam is directed onto at least a portion of said object.

13. The system according to claim 1, wherein said electroplating voltages have respective electrical potentials and said electrical potentials are connected to said anode and cathode electrodes with said potentials being periodically reversed while said beam is not being directed at least near said object.

14. The system according to claim 1, wherein said source of radio frequency (RF) provides bursts of signals having selectable durations and repetition rates.

15. The system according to claim 1, wherein said plating is performed in an electroless manner.

16. The system according to claim 1, wherein said plating solution has a desired temperature and said system further comprises means for maintaining said temperature.

17. The system according to claim 1, wherein said transducer comprises an acoustic phased array employing phase shifting techniques to focus and sweep said directed acoustic beam along at least near said object.

18. The system according to claim 17, wherein said acoustic phase array comprises a sub array grouping which derives a focal zone for creating a strip of plating for said object.

19. The system according to claim 17, wherein said acoustic phased array comprises a sub array grouping which derives multiple simultaneous beams from said directed acoustic beam.

20. The system according to claim 17, wherein said acoustic phase array is operated in a beam hopping mode.

21. The system according to claim 17, wherein said acoustic phase array is operated to derive a focus zone that is reflected off a surface and onto the object being plated.

22. The system according to claim 1, wherein said transducer further comprises means for focussing said output beam.

23. The system according to claim 1, wherein said RF source has a frequency in the range from about 1 MHZ to greater than 100 MHZ.

24. The system according to claim 1, further comprising a screen interposed between said output beam of said transducer and said object being plated.

25. The system according to claim 24, wherein said screen is of a metallic material of thin wire so as to be acoustically transparent to said output beam.

26. The system according to claim 24, wherein said screen is placed in contact with said object.

27. The system according to claim 24, wherein said screen is placed near said object.

28. The system according to claim 1, wherein said object has front and backside portions thereof and said output beam is directed onto said front portion and transmitted through said object so as to penetrate and exit from said backside of said object.

29. The system according to claim 1, wherein said transducer is in direct contact with said object.

30. The system according to claim 1, wherein said object has an open passageway in its surface and wherein said output beam is directed so that it grazes a portion of said object near said open passeageway so as to create a Bernoulli effect and induce said plating solution to flow into said passeageway.

31. The system according to claim 1, wherein said object has a cavity and wherein said output beam is directed onto said cavity.

32. The system according to claim 1, wherein said object reflects a portion of output beam directed thereon and wherein said system further comprising means for examining the output beam and beam reflected off said object.

33. The system according to claim 32, wherein said means for examining provides an acoustic image used to determine the features of said object being plated.

34. The system according to claim 32, wherein said means for examining provides sensing information indicative of the features of the object being plated.

35. A method used for plating objects comprising the steps of:
 a) providing a container holding a plating solution in which is lodged anode and cathode electrodes connected to respective electroplating voltages and with the cathode electrode connected to the object to be plated, said container having means for holding an object at least near said plating solution;
 b) providing a source of radio frequency (RF) having an output; and
 c) providing a transducer receiving said output of said RF frequency source and developing an output beam of acoustic waves which are directed at least near said object.

36. The method according to claim 35, wherein said directed beam covers a portion of said object and creates a plating level of thickness that is greater than that of the portion of said object not covered by said directed beam.

37. The method according to claim 35, wherein said source of high frequency has selectable power output levels and a power output level is selected so that said beam directed onto said object removes bubbles and debris from said object, while at the same time creates a plating on said object.

38. The method according to claim 35, wherein said electroplating voltages are first activated causing depleting of said plating solution around a portion of said object and then said directed beam is activated to cover said portion of said object depleted of said solution.

39. The method according to claim 38, wherein said method further comprises the step of providing agitation of said plating solution around said portion of said object after plating voltage is turned off and before reverse voltage is applied.

40. The method according to claim 35, wherein said source of high frequency has selectable power output levels and a power output level is selected so that said beam directed onto said object prevents concentration of gas contained in said plating solution from giving rise to bubbles therein, while at the same time creates a plating on said object.

41. The method according to claim 35, wherein a portion of said object is held so as to be suspended over said plating solution and said beam is directed onto a free surface of said plating solution at a region near said suspended portion of said object, so as to create a fountain of said plating solution which makes contact with an area of said object.

42. The method according to claim 41, wherein a portion of said object is coated with a non-wetting material.

43. The method according to claim 42, wherein said non-wetting material is selected to be a thin film of water repellant material.

44. The method according to claim 42, further comprising selecting a gasket to be placed around an edge of said object and arranging the gasket to trap gas between said object and said plating solution and to create a hydrostatic pressure between said object and said plating solution.

45. The method according to claim 42, wherein the size and shape of said contact area of said object is determined by selecting the acoustic power and shape of said acoustic beams and the distance said acoustic beam is located from said region of said plating solution.

46. The method according to claim 35, wherein said object is held so as to be immersed in said plating solution and said beam is directed onto at least a portion of said object.

47. The method according to claim 35, wherein said electroplating voltages have respective electrical potentials and said electrical potentials are connected to said anode and cathode electrodes with the potentials being periodically reversed while said beam is not being directed at least near said object.

48. The method according to claim 35, wherein said electroplating voltages are non-operable while said beam is being directed at least near said object.

49. The method according to claim 35, wherein said provided transducer is further provided with means for focussing said output beam.

50. The method according to claim 35, wherein said transducer comprises an acoustic phased array employing phase shifting techniques to focus and sweep said acoustic beam along at least near said object.

51. The method according to claim 50, wherein said acoustic phased array comprises a sub array grouping to derive multiple simultaneous beams from said directed acoustic beam.

52. The method according to claim 50, wherein said acoustic phase array is selected to comprise a sub array grouping which derives a focal zone for creating a strip of plating for said object.

53. The method according to claim 50, wherein said acoustic phase array is operated in a beam hopping mode.

54. The method according to claim 50, wherein said acoustic phase array is operated to derive a focus zone that is reflected off a surface and onto the object being plated.

55. The method according to claim 35, wherein said RF source has a frequency in the range from about 1 MHZ to greater than 100 MHz.

56. The method according to claim 35, wherein said source of radio frequency (RF) provides bursts of signals having selectable durations and repetition rates.

57. The method according to claim 35, further comprising a step of interposing a screen between said output beam of said transducer and said object being plated.

58. The method according to claim 57, wherein said screen is of a metallic material of thin wire so as to be acoustically transparent to said output beam.

59. The method according to claim 57, wherein said screen is placed in contact with said object.

60. The method according to claim 59, wherein said screen is placed near said object.

61. The method according to claim 35, wherein said object has front and backside portions thereof and said output beam is directed onto said front portion and transmitted through said object so as to penetrate and exit from said backside of said object.

62. The method according to claim 35, wherein said transducer is in direct contact with said object.

63. The method according to claim 35, wherein said object has an open passeageway in its surface and wherein said output beam is directed so that it grazes a portion of said object near said open passeageway so as to create a Bernoulli effect and induce said plating solution to flow into said passageway.

64. The method according to claim 35, wherein said object has a cavity and wherein said output beam is directed onto said cavity.

65. The method according to claim 35, wherein said object reflects a portion of output beam directed thereon and wherein said system further comprising means for examining the output beam and beam reflected off said object.

66. The method according to claim 65, wherein said means for examining is operated so as to provide an acoustic image used to determine the features of said object being plated.

67. The method according to claim 65, wherein said means for examining is operated so as to provide sensing information indicative of the features of the object being plated.

* * * * *